(12) United States Patent
Hirler et al.

(10) Patent No.: US 7,781,842 B2
(45) Date of Patent: Aug. 24, 2010

(54) SEMICONDUCTOR DEVICE AND METHOD FOR PRODUCING IT

(75) Inventors: Franz Hirler, Isen (DE); Elmar Falck, Ottobrunn (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 119 days.

(21) Appl. No.: 12/112,624

(22) Filed: Apr. 30, 2008

(65) Prior Publication Data
US 2008/0265329 A1 Oct. 30, 2008

(30) Foreign Application Priority Data
Apr. 30, 2007 (DE) .................. 10 2007 020 659

(51) Int. Cl.
*H01L 27/07* (2006.01)
*H01L 29/08* (2006.01)
(52) U.S. Cl. ............ 257/367; 257/E29.04; 257/E27.029
(58) Field of Classification Search ................. 257/367, 257/E29.04, E27.029
See application file for complete search history.

(56) References Cited

U.S. PATENT DOCUMENTS

| | | | | |
|---|---|---|---|---|
| 3,845,495 A | * | 10/1974 | Cauge et al. ................. | 257/336 |
| 4,412,242 A | * | 10/1983 | Herman et al. .............. | 257/634 |
| 4,468,686 A | | 8/1984 | Rosenthal | |
| 5,347,155 A | * | 9/1994 | Ludikhuize ................. | 257/492 |
| 5,907,173 A | * | 5/1999 | Kwon et al. ................. | 257/336 |
| 6,064,086 A | * | 5/2000 | Nakagawa et al. .......... | 257/335 |
| 6,762,455 B2 | | 7/2004 | Oppermann et al. | |
| 2006/0006386 A1 | * | 1/2006 | Hirler et al. .................. | 257/60 |
| 2008/0179672 A1 | * | 7/2008 | Hirler et al. ................. | 257/342 |
| 2008/0265277 A1 | * | 10/2008 | Hirler et al. ................. | 257/139 |

FOREIGN PATENT DOCUMENTS

| | | |
|---|---|---|
| DE | 198 15 907 | 5/1999 |
| DE | 10 2004 041 198 | 3/2006 |
| DE | 102004056772 | 1/2007 |
| DE | 10 2005 048 447 | 7/2007 |
| EP | 0472274 | 2/1992 |

OTHER PUBLICATIONS

Tolksdorf, Kompenastionsstrukturen fur laterale Leistungs-MOSFETs, Dec. 4, 2005, 241 pages.
Berberich, Sven, Entwicklung, Herstellung und Charakterislerung von Integrierbaren Leistungsbauelementen und einer Trench-Gate Technologie, Erlangen, 2005 (including English Abstract).

* cited by examiner

*Primary Examiner*—Victor A Mandala
(74) *Attorney, Agent, or Firm*—Dicke, Billig & Czaja, PLLC

(57) ABSTRACT

A semiconductor device which has a semiconductor body and a method for producing it. At the semiconductor body, a first electrode which is electrically connected to a first near-surface zone of the semiconductor body and a second electrode which is electrically connected to a second zone of the semiconductor body are arranged. A drift section is arranged between the first and the second electrode. In the drift section, a coupling structure is provided for at least one field plate arranged in the drift section. The coupling structure has a floating first area doped complementarily to the drift section and a second area arranged in the first area. The second area forms a locally limited punch-through effect or an ohmic contact to the drift section, and the field plate is electrically connected at least to the second area.

17 Claims, 12 Drawing Sheets

SEMICONDUCTOR DEVICE AND METHOD FOR PRODUCING IT

CROSS-REFERENCE TO RELATED APPLICATIONS

This Utility Patent Application claims benefit of German Patent Application 10 2007 020 659.5, filed Apr. 30, 2007, incorporated herein.

BACKGROUND

The disclosure generally relates to a semiconductor device with field plate and floating, complementarily-doped area and to a method for producing it. The semiconductor device includes a semiconductor body including a first electrode which is electrically connected to a first near-surface zone of the semiconductor body and of a second electrode which is electrically connected to a second zone of the semiconductor body. Between the first and the second electrode, a drift section is arranged in the semiconductor body. In the drift section, field plates with floating areas doped complementarily to the drift section are arranged which influence the field distribution in the drift section.

Such semiconductor devices have the characteristic that during a switching process, in which the device changes from a non-conducting into a conducting state, p-type charge carriers, that is to say holes, cannot flow quickly enough to these floating areas doped complementarily to the drift section, so that the field plates coupled on are capacitively drawn to a negative potential during the switching-on. This negative potential produces a depletion of charge in the drift section and can distinctly reduce the current flow on reactivation, that is to say after a transition from the non-conducting into the conducting state, until the potential of the field plates is raised again by leakage currents.

If an additional p⁻-conducting layer is implanted close to the surface for the floating p-conducting areas and possibly diffused out with a net doping approximately of the magnitude of the breakdown charge of the semiconductor which is approx. $2 \times 10^{12}$ cm$^{-2}$ with low-doped silicon, the floating areas doped complementarily to the n-conducting drift section can be discharged more rapidly. For this purpose, the p⁻-conducting layer of a MOSFET or of an IGBT is connected to a source potential or to an emitter potential, for example by overlapping with a body zone. However, the dopant boundary, and thus the conductivity of the discharge structure, is disadvantageously bound to the breakdown charge. Although p-type regions doped less are possible, they do not allow an optimum hole conductivity. In addition, the blocking capability is reduced since, in the non-conducting case, an additional vertical electrical field is produced at the p⁻-n⁻junction between p-conducting region of a body zone and an n-conducting drift section, which field is superimposed on the lateral field, but the blocking capability is reduced in this semiconductor device. This reduction in blocking capability can be verified by a compression of the equipotential lines at the upper pn junction. More highly doped p-type regions prevent a useful blocking capability.

It is also possible to discharge the floating areas doped complementarily to the drift section using p-channel MOSFETs to be provided additionally. Initially, the field plates and the floating areas doped complementarily to the drift section connected to the field plates become charged to a negative potential relative to a source or emitter electrode, respectively, as described, when the semiconductor device is switched on. If gate electrodes of the p-channel MOSFETs, to be provided additionally, which are connected to the floating areas doped complementarily to the drift section, are in each case placed at a negative potential, a p-conducting channel which enables the floating areas to become discharged is automatically produced when the semiconductor device is switched on. However, the field plates cannot be completely discharged via the additional p-channel transistors because of the finite starting voltage of these additional p-channel transistors.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
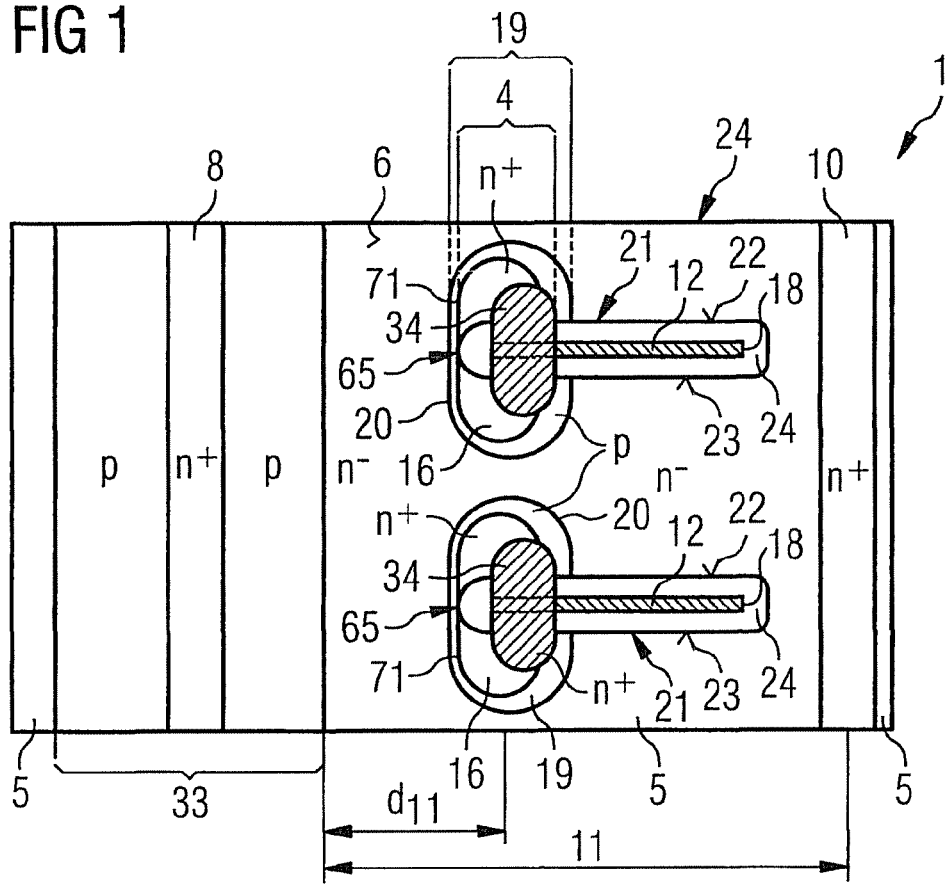
FIG. 1 illustrates a diagrammatic top view of a semiconductor device of one embodiment.
Figure 2:
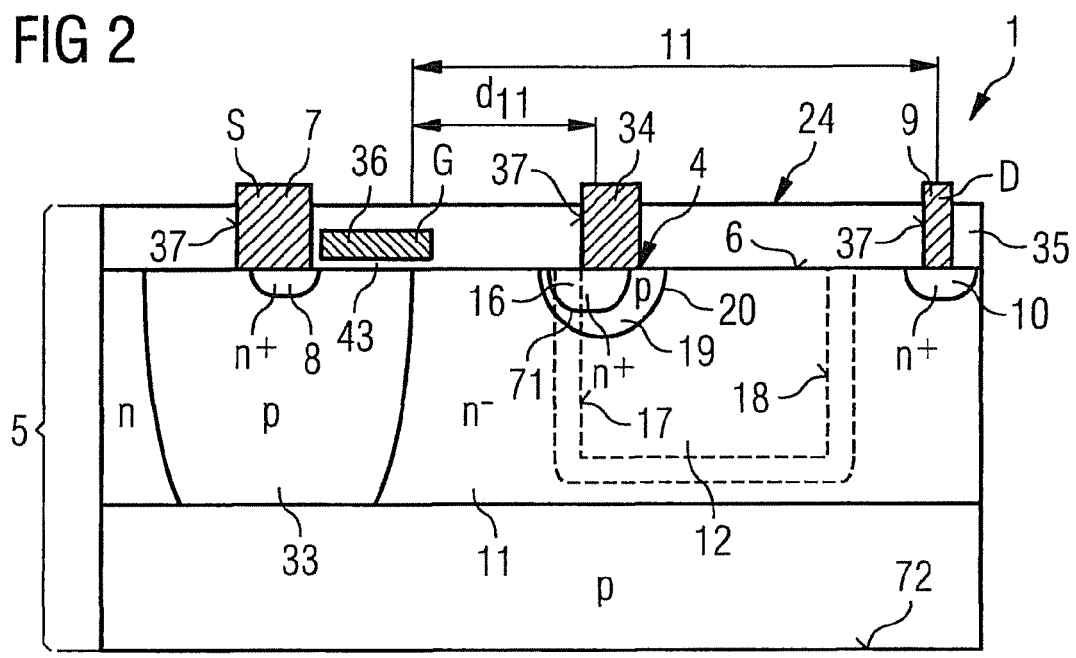
FIG. 2 illustrates a diagrammatic cross section through the semiconductor device according to FIG. 1.

FIGS. 1 and 2 illustrate a coupling structure 4, based on the punch-through effect, which in the present case contributes in a locally limited way to the discharge of floating first areas 19 which are connected to field plates 12. The field plates 12 influence the field distribution in a drift section 11 in such a manner that the device can accommodate higher voltages than a device without field plates. In this arrangement, the drift section 11 is laterally oriented.

The semiconductor device 1 illustrated in FIGS. 1 and 2 includes a semiconductor body 5, on the top side 6 of which a first electrode 7 is electrically connected to a first near-surface zone 8 of the semiconductor body 5. A second electrode 9 is electrically connected to a second near-surface zone 10 of the semiconductor body 5. Between the first and the second electrode 7 and 9, respectively, a lateral drift section 11 is arranged in the semiconductor body 5.

In the lateral arrangement of the first and of the second electrode 7 and 9, respectively, illustrated on the top side 6 of a semiconductor body 5, the first complementarily-doped area 19 and a second area 16 are arranged close to the surface. The areas 16 and 19 are buried on other embodiments. With this lateral arrangement of the first and of the second area 19 and 16, respectively, the first complementarily-doped area 19 and the second highly doped area 16 in the drift section 11, with a correspondingly lateral arrangement of the first and of the second electrode 7 and 9, respectively, are positioned in such a manner that the first area 19 is oriented in the direction of the second electrode 9 and the second area 16 is oriented in the direction of the first electrode 7 so that an asymmetric arrangement of the area 16 in the area 19 is obtained, the distance of the area 16 to low voltage point being smallest. The injecting or generating second area 16 is ideally positioned in such a manner that it is arranged closer to the low voltage point 65 of a complementarily-doped floating first area 19 than at all other points of the pn junction between the first area 19 and the drift section structure of a drift section 11. In this context, a low voltage point is understood to be a point on the pn junction between drift section 11 and the first area 19 at which, in the non-conducting case, the space charge zone originating from the body zone pn junction first contacts the pn junction between drift section 11 and the first area 19.

In this arrangement, a number of floating areas 19 with discharge structure 4 can also be arranged at the lateral current path between the first and the second electrode 7 and 9, respectively, laterally in the drift section 11 between first and second electrodes 7 and 9, respectively, as is illustrated in the subsequent further FIGS. 7 to 9 and 12 and 13.

FIG. 1 illustrates a diagrammatic top view of the semiconductor device 1. In this top view, the structures above a top side 6 of a semiconductor body 5 have been omitted apart from the coupling structures 4 to a field plate 12 and to the drift section 11. The top side 6 of the semiconductor body 5 illustrates the first near-surface zone 8 for the first electrode 7 which is illustrated in FIG. 2. In this embodiment, this first near-surface zone 8 is strip-shaped and n$^+$-conducting and surrounded by a strip-shaped body zone 33 which has a type of conduction complementary to the zone 8. The zones 8 and 10 can also have other suitable geometries than rectangular.

The body zone 33 is adjoined in the lateral direction by an n$^-$-conducting drift section 11 which extends up to a second near-surface zone 10 for an electrode 9 illustrated in FIG. 2 and is n$^+$-conducting.

In the drift section 11, field plates 12 are arranged in trench structures 21 which are surrounded by an insulating layer 24 on the trench walls 22 and 23. For this purpose, the field plates 12 are laterally oriented and protrude vertically into the drift section 11. In order to enable the field plates 12 to be coupled to the drift section 11, a coupling structure 4 is arranged at $d_{11}$, which has an n$^+$-conducting second area 16, which is arranged inside the first area 19, close to ends 17 of the field plates 12. However, the coupling structure 4 can also be, e.g., central with respect to the field plates or displaced in the direction of the second electrode, depending on the embodiment of the field plates and the dopant ratios.

The first area 19 which is doped complementarily to the drift section 11 and which surrounds the second area 16 prevents that the space charge zone forming during the switch-over into the non-conducting state, in the drift section 11, reaches up to the second area 16 and leakage currents spread out. The field plates 12 only accept over their entire length the potential which prevails at the drift section length $d_{11}$, the second area 16, in this embodiment, being doped n$^+$-conducting in such a magnitude that a punch-through effect to the drift section 11 is ensured in the conducting case.

Figure 11:
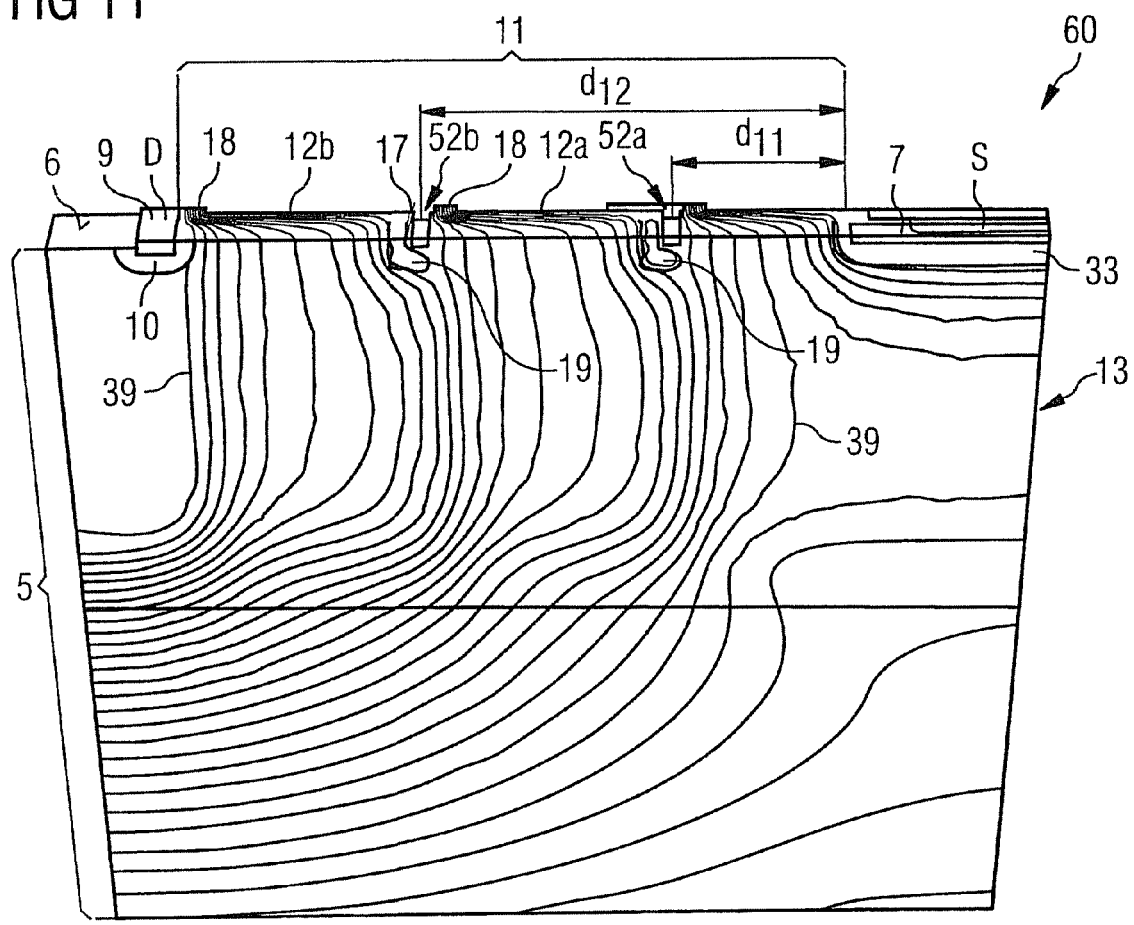
FIG. 11 illustrates the cross-sectional area according to FIG. 10 with equipotential lines.

In addition, the n$^+$-conducting area 16 is arranged floating in the complementarily-doped first area 19 which forms a pn junction 20 with the material of the drift section 11, this pn junction 20 and this complementarily conducting first area 19, respectively, ensuring that the space charge zone, and respectively the equipotential lines resulting from it, spread towards the second near-surface zone 10, as is also illustrated in FIG. 11, so that the space charge zone can be spanned further in the direction of the second near-surface zone 10. This structure makes it possible that fast coupling of the field plates 12 can be achieved when the transistor changes from the non-conducting to the conducting state.

FIG. 2 illustrates a diagrammatic cross section through the semiconductor device 1 according to FIG. 1, wherein the top side 6 of the semiconductor body 5 now has a structure, applied to the top side 6, with an insulating layer 35. The insulating layer 35 has windows to the top side 6 of the semiconductor body 5. The first electrode 7 is arranged as source electrode S of a MOSFET and the second electrode 9 is arranged as drain electrode D in the windows in order to contact the near-surface zones 8 and 10, respectively. The drift section 11 is arranged on a p$^-$-conducting substrate of the semiconductor body 5 with the underside 72.

In addition, the second area 16 and the first area 19 are jointly contacted as device of the coupling structure 4 by a conducting field plate contact 34 in a window 37 of the insulating layer 35. This field plate contact 34 is arranged close to the end 17 at the source side of the field plate 12, the contours of which are illustrated here in dashed lines, and forms a local coupling structure 4.

In the insulating layer 35, a control electrode 36 is arranged as insulated gate electrode G above the body zone 33. The first electrode 7 forms a source electrode S which short-circuits the pn junction between the n$^+$-conducting first near-surface zone 8 and the p-conducting area of the body zone 33. The control electrode 36, as gate electrode G, influences the near-surface field distribution in the body zone 33 via a gate oxide 43 in such a way that an n-conducting channel is formed when the MOSFET conducts. The gate electrode can also be arranged, for example, in a trench.

Such a semiconductor device 1 has the advantage that previous floating first areas 19, doped complementarily to the drift section 11, which are coupled to field plates, can be coupled, via a second area 16 which has a locally limited punch through effect to the drift section 11, to field plates 12 without the risk arising that, during a switching process in which the semiconductor device 1 changes from the non-conducting to the conducting state, charge carriers cannot flow into it quickly enough, which are now available in sufficient quantity via the punch-through effect to the drift section 11 of the second area 16. During this process, the field plates 12 are promptly discharged.

If the field plate contact 34 does not contact the first area 19, the voltage can differ nevertheless, only by a relatively low Zener/avalanche voltage, due to the high doping of these two areas 16 and 19, respectively. Thus, the floating p-conducting first area 19 will be discharged down to this low zener/avalanche voltage during the switching-through of a non-conducting lateral drift zone structure.

Instead of the n$^+$-conducting second area 16, a metallic or, e.g., amorphisized area can be incorporated in the top side of the semiconductor body 5. A second area 16 prepared in this manner can also have a locally limited punch-through effect which enables the first floating area 19 to be quickly discharged. For this purpose, the second area 16, during the switch-over into the conducting case, injects or generates charge carriers which swamp the complementarily-doped first area 19. In the non-conducting case, the first area 19 shields the second area 16 from the second electrode 9 so that leakage currents are prevented. The second area 16 can also be a localized second area 16 with reduced generation life which has a locally limited punch-through effect. By using the locally limited punch-through effect, the electrical field can reach through to the second area 16 and discharge it and the first area 19.

Figure 3:
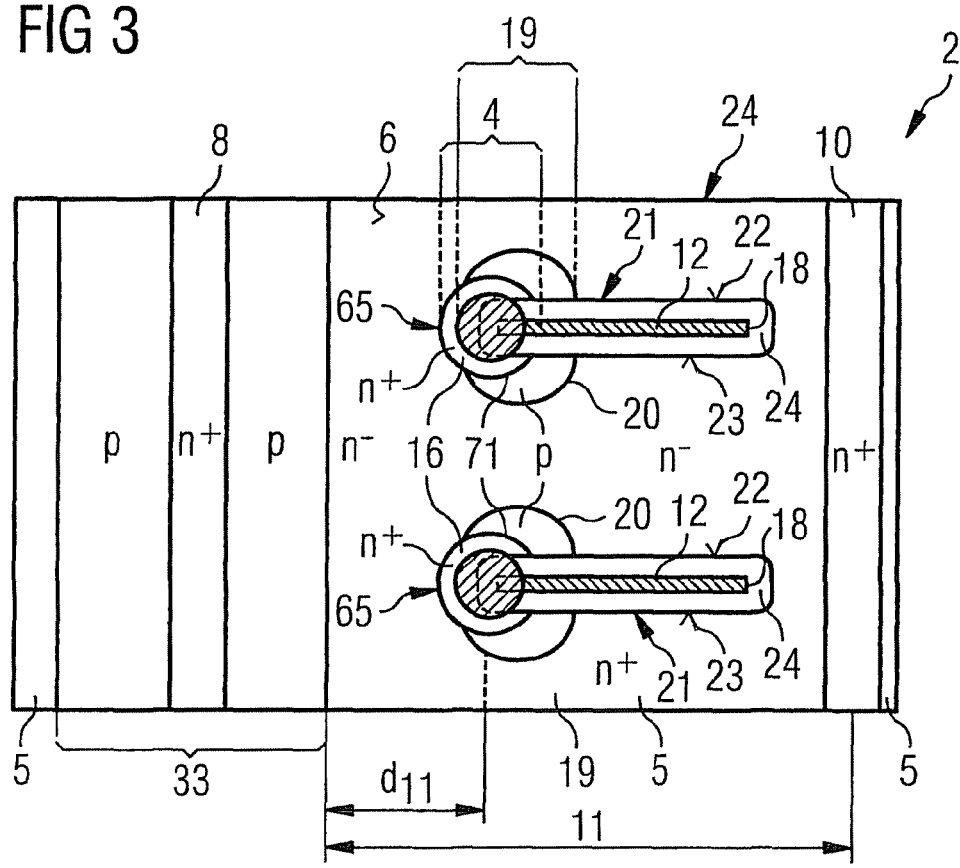
FIG. 3 illustrates a diagrammatic top view of a semiconductor device of a further embodiment.
Figure 4:
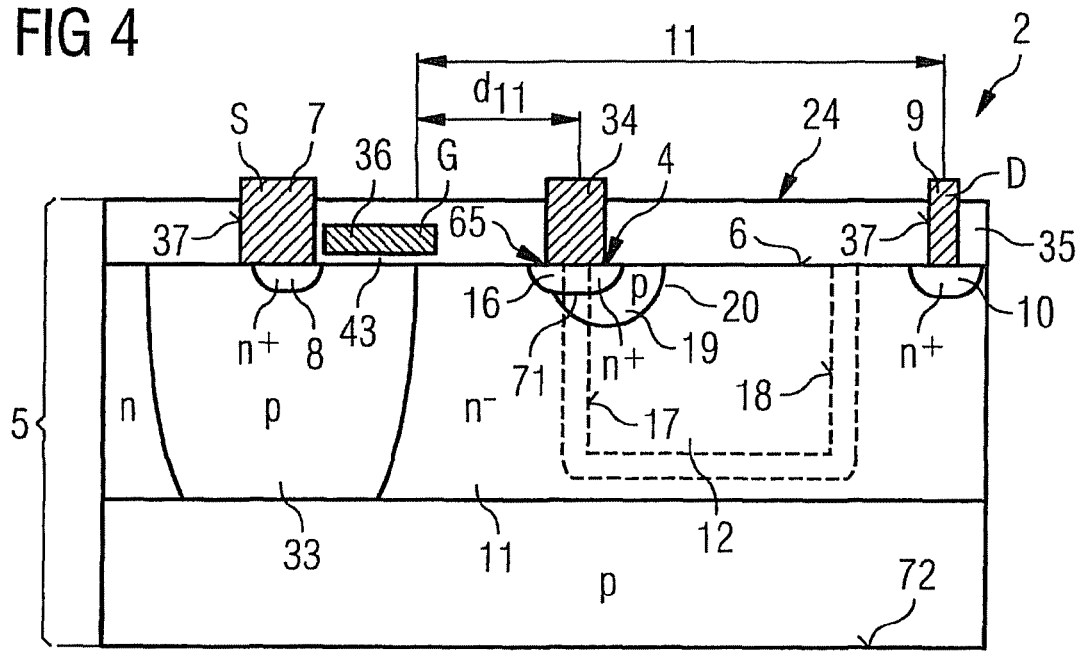
FIG. 4 illustrates a diagrammatic cross section through the semiconductor device according to FIG. 3.

Like the semiconductor device 1 of FIGS. 1 and 2, the semiconductor device 2 illustrated in FIGS. 3 and 4 includes a semiconductor body 5. In this illustrative embodiment, however, it is not the punch-through effect to the drift section which is used for achieving coupling, but an ohmic contact between the drift section material and the second area 16 which is used. On the top side 6 of the semiconductor body, a first electrode 7 which is electrically connected to a first near-surface zone 8 of the semiconductor body 5 and a second electrode 9 which is electrically connected to a second near-surface zone 10 of the semiconductor body 5 are again arranged. Between the first and the second electrode 7 and 9, respectively, a lateral drift section 11 is arranged in the semiconductor body 5.

FIG. 3 illustrates a diagrammatic top view of the semiconductor device 1. In this top view, the structures above a top side 6 of a semiconductor body 5 have been omitted apart from the coupling structures 4 to a field plate 12 and to the drift section 11. The top side 6 of the semiconductor body 5 illustrates the first near-surface zone 8 for the first electrode 7 which is illustrated in FIG. 4. In this further embodiment, this first near-surface zone 8 is strip-shaped and n$^+$-conducting and surrounded by a strip-shaped body zone 33 which has a type of conduction complementary to the zone 8. The body zone 33 is adjoined in the lateral direction by an n$^-$-conducting drift section 11 which extends up to a second near-surface zone 10 for an electrode 9 illustrated in FIG. 2 and is n$^+$-conducting.

In the drift section 11, field plates 12 are arranged in trench structures 21 which are surrounded by an insulating layer 24 on the trench walls 22 and 23. For this purpose, the field plates 12 are laterally oriented and protrude vertically into the drift section 11. To provide for a coupling of the field plate 12 to the drift section 11, a coupling structure 4 is arranged at $d_{11}$ which, close to one end 17 of the field plate 12 has an n$^+$-conducting second area 16 which overlaps the first area 19 and forms an ohmic contact with the drift section 11 on the side facing the first electrode 7.

The first area 19 which is doped complementarily to the drift section 11 and which only partially surrounds the second area 16 prevents that the space charge zone, forming during the switch-over into the non-conducting state, in the drift section 11 reaches to the second area 16 and leakage currents spread out. The field plates 12 only accept the potential prevailing at the drift section length $d_{11}$ over their entire length. So that the space charge zone can spread out further in the direction of the second electrode from the first area 19, it encloses the areas 19 and 16 as far as possible, in which arrangement, however, the ohmic contact between the second area 16 and the drift section 11 should be ensured.

In addition, the n$^+$-conducting area 16 and the complementarily-doped first area 19, which forms a pn junction 20 with the material of the drift section 11, are arranged to be floating, wherein this pn junction 20 or this complementarily conducting first area 19, respectively, ensures that the space charge zone or the resultant equipotential lines, respectively, spread out to the second near-surface zone 10 as is also illustrated in FIG. 11, so that the space charge zone can be spanned further in the direction of the second near-surface zone 10. This structure makes it possible to achieve fast coupling of the field plates 12 without any threshold on transition of the transistor from the non-conducting to the conducting state.

FIG. 4 illustrates a diagrammatic cross section through the semiconductor device 1 according to FIG. 3, wherein the top side 6 of the semiconductor body 5 now has a structure, applied to the top side 6, with an insulating layer 35. The insulating layer 35 has windows 37 to the top side 6 of the semiconductor body 5. The first electrode 7 is arranged as source electrode S of a MOSFET and the second electrode 9 is arranged as drain electrode D in the windows 37 in order to contact the near-surface zones 8 and 10, respectively.

In addition, in this embodiment, only the second area 16 is contacted in a window 37 of the insulating layer 35 by a conducting field plate contact 34 as device of the coupling structure 4. This field plate contact 34 is arranged close to the end 17 at the source side of the field plate 12, the contours of which are illustrated here in dashed lines, and forms a local coupling structure 4. Depending on the embodiment of the field plates and dopant ratios, the coupling structure 4 can also be, for example, central with respect to the field plates or displaced in the direction of one end 18 of the field plates.

In the insulating layer 35, a control electrode 36 is arranged as insulated gate electrode G above the body zone 33. The first electrode 7 forms a source electrode S which short-circuits the pn junction between the n$^+$-conducting first near-surface zone 8 and the p-conducting area of the body zone 33. The control electrode 36, as gate electrode G, influences the near-surface field distribution in the body zone 33 by a gate oxide 43 to the extent that an n-conducting channel forms when the MOSFET is switched on.

For this purpose, the second area 16 can be coupled via a metallic or another region generating charge carriers to the complementarily-doped floating first area 19. Accordingly, this second area 16 can be coupled to the first area 19 not only via a pn junction as described above but also via an ohmic contact. For this purpose, the ohmic contact can be implemented via a metallic layer or also via a metal arranged on the top side of the semiconductor body 5.

Such a semiconductor device 2 has the advantage that previous floating first areas 19 doped complementarily to the drift section 11, which are coupled to field plates 12, can be coupled to field plates via a second area 16 which has an ohmic contact to the drift section, without there being the risk that, during a switching process in which the semiconductor device 2 changes from the non-conducting to the conducting state, charge carriers, which are now available in sufficient quantity via the ohmic contact to the drift section 11 of the second area 16, cannot flow into it quickly enough. In this arrangement, the field plates are promptly discharged.

In this embodiment, illustrated in FIG. 4, the coupling is accelerated by the second area 16 which is oriented in the direction of the first electrode 7 on the top side 6 of the semiconductor body 5 and is shielded towards the second electrode 9 of the semiconductor body 5 by the first floating complementarily-doped area 19. In this embodiment, a pn junction which represents an ohmic contact to the drift section 11 and which is shielded by the first complementarily-doped area 19 in the non-conducting case, is thus arranged between the highly doped second area 16 and the complementarily-doped first area 19. The coupling between the areas 16 and 19 is effected via the pn zener junction. In this arrangement, the second area 16 has an $n^+$-region towards the first electrode 7 which has contact to an $n^-$-drift zone 11 and is shielded towards the second electrode 9 by the floating p-conducting first area 19.

It is a further advantage of this embodiment of the coupling structure 4 that it can be used in many ways. Thus, it can be used generally for discharging arbitrarily patterned complementarily-doped floating first areas 19 in the drift section 11.

To implement the abovementioned ohmic contact, it is also provided that the coupling structure 4 has, in the second area 16 injecting or generating charge carriers, impurity atoms which act like an ohmic contact to the surrounding laterally oriented drift section 11, wherein impurity atoms or crystal defects with deep centers in the band gap enable charge carriers to be generated.

In a method for producing a number of semiconductor chips for semiconductor devices 1 or 2 with field plate coupling structure 4 to a drift section 11, the method includes the following. A semiconductor wafer is prepared from a semiconductor body 5 with semiconductor device structures in semiconductor chip positions which are suitable for lateral diode, or MOSFET and/or IGBT structures. For this purpose, a lateral drift section 11 is provided between a first near-surface zone 8 of the semiconductor body 5 and a second near-surface zone 10 of the semiconductor body 5, and for a first electrode 7 and a second electrode 9, respectively.

Dopants of a type of conduction complementary to the drift section 11 with identical drift section lengths $d_{11}$ for floating first areas 19 are incorporated into the drift section 11. After that, dopants of the same type of conduction as the drift section 11 are incorporated with identical drift section lengths $d_{11}$ in higher concentration than the drift section 11 for highly doped second areas 16 as coupling structure 4 close to a low voltage point 65 of the first area 19. In addition, laterally oriented vertical trench structures 21 are prepared in the lateral drift section 11, which extend into the coupling structure 4. An insulating layer is deposited on the walls 22 and 23 of the trench structures 21. After that, the trench structures 21 are filled up with a conducting material to field plates 12 and the lateral diode, or MOSFET and/or IGBT structures are completed, field plate contacts 34 being established between the field plates 12 and at least the second area 16 during the application of the first and second electrodes 7 and 9.

The order of the individual process processes can be changed in many ways. Thus, it is appropriate with thermal oxides in the trench to incorporate the dopant regions only after completion of trenches and field plates so that the out-diffusion remains limited.

In this method, it is provided that the trench structures 21 and the coupling structures 4 can be produced on a semiconductor wafer basis even before the semiconductor wafer is separated into individual semiconductor chips. This reduces the cost of producing individual semiconductor chips.

A method for producing a number of semiconductor devices 1 or 2 includes the following. A semiconductor wafer is produced in accordance with the production processes described above with a number of semiconductor chips for semiconductor devices 1 or 2 with coupling structure 4 for field plates 12. Following this, the semiconductor wafer is separated into semiconductor chips. Some of these semiconductor chips are applied to a chip carrier with a number of external contacts in a number of semiconductor device positions. The electrodes 7 and 9 of the semiconductor chips are connected to contact pads which are electrically connected to the external contacts via connecting elements. After that, a semiconductor device package can be applied by enclosing the individual semiconductor chips and the connecting elements, and finally the circuit carrier is separated into individual semiconductor devices with discharge structure 4.

This method, too, has the advantage that a plurality of semiconductor devices can be produced in parallel. For this purpose, some processes, such as applying semiconductor chips, incorporating connecting elements and packaging the semiconductor chips, can be performed simultaneously.

Figure 5:
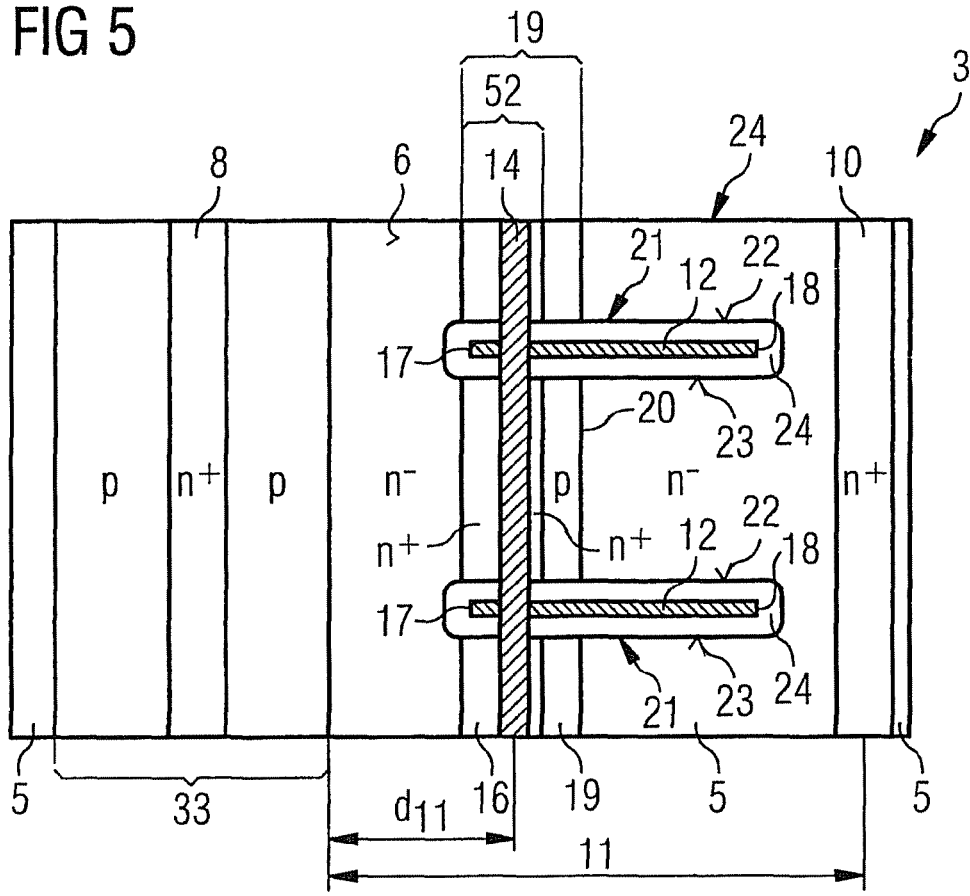
FIG. 5 illustrates a diagrammatic top view of a semiconductor device of a further embodiment.
Figure 6:
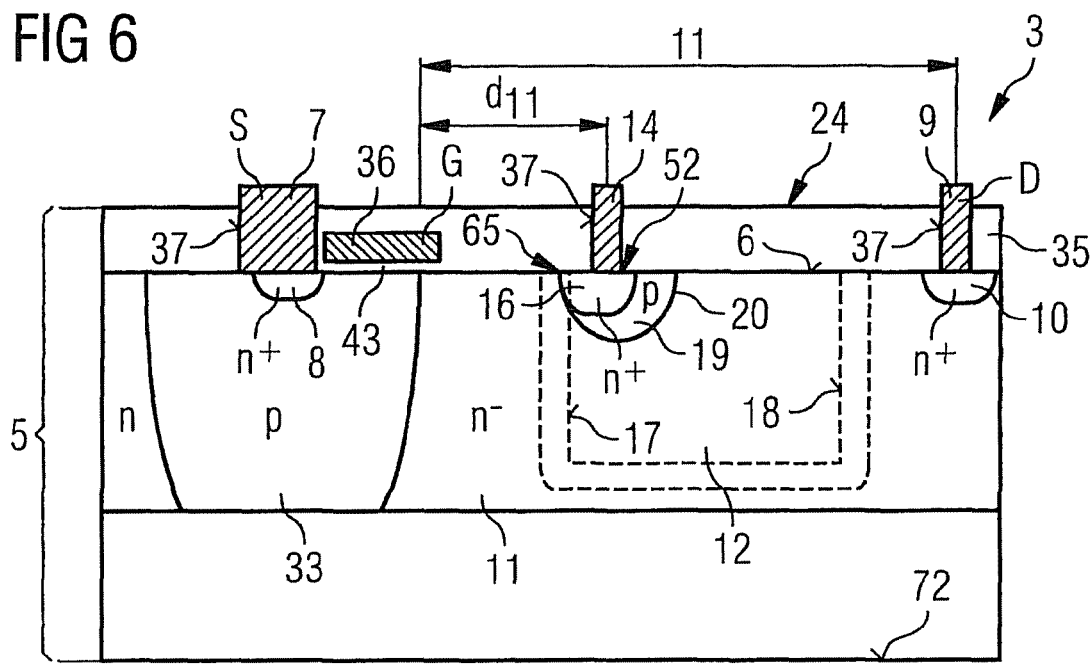
FIG. 6 illustrates a diagrammatic cross section through the semiconductor device according to FIG. 5.

The semiconductor device 3 illustrated in FIG. 5 and 6 includes a semiconductor body 5, on the top side 6 of which a first electrode 7, which is electrically connected to a first near-surface zone 8 of the semiconductor body 5, and a second electrode 9 which is electrically connected to a second near-surface zone 10 of the semiconductor body 5 are arranged. Between the first and the second electrode 7 and 9, respectively, a lateral drift section 11 is arranged in the semiconductor body 5.

FIG. 5 illustrates a diagrammatic top view of the semiconductor device 3. In this top view, the structures above a top side 6 of a semiconductor body 5 have been omitted apart from a conductor track 14 which is part of a discharge structure 52. The top side 6 of the semiconductor body 5 illustrates a first near-surface zone 8 for a first electrode 7 which is illustrated in FIG. 6. In this embodiment, this first near-surface zone 8 is $n^+$-conducting and surrounded by a body zone 33 which has a complementary type of conduction to the zone 8.

The body zone 33 is adjoined by an $n^-$-conducting drift section 11 which extends to a second near-surface zone 10 for an electrode 9, illustrated in FIG. 6, and is also $n^+$-conducting. In the drift section 11, field plates 12 are arranged in trench structures 21 which are surrounded by an insulating layer 24 on the trench walls 22 and 23. For this purpose, the field plates 12 are laterally oriented and protrude vertically into the drift section 11.

To provide for charging and discharging of the field plates 12, a conductor track 14 is arranged at $d_{11}$ which electrically connects the field plates 12 close to one of their ends 17 and contacts an $n^+$-conducting strip-shaped second area 16 in the drift section 11 at $d_{11}$. An also strip-shaped first area 19, which is doped complementarily to the drift section 11 and which overlaps the second area 16 towards the first electrode 7, prevents that the space charge zone forming during switchover into the non-conducting state extends to the second area 16 and the conductor track 14 in the drift section 11 and leakage currents spread out. The field plates 12 only accept along their entire length the potential which prevails at the drift section length $d_{11}$, the second area 16 being conductively connected to the drift section 11 by an ohmic contact.

In addition, the complementarily-doped first area 19, which forms a pn junction 20 with the material of the drift section 11, is arranged floatingly next to and below the $n^+$-conducting area 16 in the direction of the second near-surface zone 10, this pn junction 20 or this complementarily-conducting first area 19, respectively ensuring that the space charge zone or the resultant equipotential lines spread out towards the second near-surface zone 10, as also illustrated in FIG. 11, so that the space charge zone can be spanned further in the direction of the second near-surface zone 10. This structure, particularly with the conductor track 14 on the same drift section length $d_{11}$, makes it possible that a fast discharge of the field plates 12 can be achieved without any threshold during a transition of the transistor from the non-conducting into the conducting state.

FIG. 6 illustrates a diagrammatic cross section through the semiconductor device 3 according to FIG. 5, wherein the top side 6 of the semiconductor body 5 now has a structure, applied to the top side 6, of an insulating layer 35. The insulating layer 35 has windows 37 towards the top side 6 of the semiconductor body 5. The first electrode 7 is arranged as source electrode S of a MOSFET and the second electrode 9 is arranged as drain electrode D in the windows in order to contact the near-surface zones 8 and 10, respectively. In addition, the conductor track 14, as device of the discharge structure 52, is arranged in a window 37 of the insulating layer 35 and contacts the field plates 12 close to the end 17 at the source side of the field plate 12, the contours of which are illustrated here in dashed lines. In addition, the conductor track 14 contacts the strip-shaped $n^+$-conducting second area 16 which, in interaction with the conductor track 14 and the strip-shaped first area 19, forms the discharge structure 52 for the field plates 12. Whereas the first area 19 and the second area 16 and the conductor track 14 are arranged to be strip-shaped in the top view illustrated in FIG. 5 in this embodiment, such a conductor track 14 can also electrically connect the individual, locally arranged coupling structures 4 to form a discharge structure as illustrated in FIGS. 1 to 4.

In the insulating layer 35, a control electrode 36 is arranged above the body zone 33 as insulated gate electrode G. The first electrode 7 forms a source electrode S which short-circuits the pn junction between the $n^+$-conducting first near-surface zone 8 and the p-conducting area of the body zone 33. If the device should also block for some volts in the reverse direction, the first zone 8 and the body zone 33 are not short-circuited. As gate electrode G, the control electrode 36 influences the near-surface field distribution in the body zone 33 via a gate oxide 43 to the extent that an n-conducting channel forms when the MOSFET conducts.

As mentioned above, the discharge structure 52 does not only have the conductor track 14 but also the two strip-shaped areas 16 and 19 in this embodiment, wherein the highly doped $n^+$-conducting second area 16 protrudes into the p-conducting first area 19 so that a crescent-shaped pn junction 20/71 is produced in the cross section of the discharge structure 52. The significance of these two strip-shaped areas 16 and 19 has already been explained in the preceding figures so that another description can be omitted.

Such a semiconductor device 3 has the advantage that the field plates 12 can be discharged via two areas 16 which have ohmic contacts to the drift section without there being the risk that, during a switching process in which the semiconductor device 3 changes from the non-conducting to the conducting state, charge carriers, which are now available in sufficient quantity via the ohmic contacts of the second areas 16, cannot flow into these quickly enough.

Neither is an additional vertical electrical field produced which becomes superimposed on the field of the drift section 11 as in the case of a discharge structure with the aid of additional p-type discharge structures. Thus, the blocking capability of the semiconductor device 3 is not reduced with such an embodiment in spite of the discharge structure 52. Finally, no finite residual voltages are formed when utilizing the ohmic contacting to the drift section in the low voltage point as in the case of discharge structures via p-channel transistor structures so that a complete discharge of the complementarily-doped floating first areas 19 and of the field plates 12 is possible.

In this arrangement, the semiconductor device 3 has the discharge structure 52 in which the second area 16 forms an ohmic contact to the drift section 11 which is highly doped and has the same type of charge carrier as the drift section 11. In this context, the second area 16 is shielded from the second electrode by the first complementarily-doped area 19 in the non-conducting case. Due to this shielding, the second area 16 is not in the area of the space charge zone which forms originating from the second electrode 9 in the non-conducting case so that no leakage currents are caused.

In this embodiment, the field plates 12, which influence the field distribution in the drift section 11, are oriented isolated laterally in the drift section 11 and protrude vertically into the drift section 11. The field plates 12 are electrically coupled to a discharge structure 52 via which the field plates 12 are electrically coupled to one another by an ohmic contact. For this purpose, the discharge structure 52 has electrically conducting conductor tracks 14 on the top side 6 of the semiconductor body 5 which electrically connect the field plates 12 to one another in groups and/or in a ring line with identical drift section lengths $d_{11}$. In this arrangement, the conductor tracks 14 contact the second areas 16 of the discharge structure 4. In this arrangement, the second areas 16 are oriented in the direction of the first electrode 7 and are shielded in the direction of the second electrode 9 with the aid of the first areas 19 which are doped complementarily to the drift section 11.

This discharge structure 52 has the advantage that due to the conductor tracks 14 of the discharge structure 52, which are arranged transversely to the drift section 11, the drift section 11 itself is not short-circuited since the electrically conducting conductor tracks 14 are arranged on identical drift section lengths $d_{11}$. At this drift section length $d_{11}$, the drift section 11 has an identical potential for all field plates 12 so that the operation of the drift section 11 is not impaired by the short-circuiting conductor tracks. On the other hand, each of the field plates 12 can be discharged completely and within a short time via the associated conductor track 14 during the switching from the non-conducting case to the conducting case. The difficulty of discharging the field plates 12 and/or the floating areas 19 via floating areas no longer exists.

Since initially, due to the ohmic contacting to the drift section, no pn junctions are provided either which become superimposed on the lateral field, the blocking capability of the semiconductor device 1 is not reduced, either. Finally, it is not necessary, either, to overcome starting voltages as in the case of a discharge structure with p-channel MOSFET structures. Instead, the field plates 12 are electrically connected by the ohmic contact transition to the conductor tracks 14 which cross the drift section 11 on equipotential lines and can thus completely discharge the field plates 12.

Such a discharge structure 52 for field plates 12 crosses the laterally arranged field plates 12 perpendicularly with its conductor tracks 14 and is arranged at identical drift section lengths $d_{11}$, the drift section 11 having below these conductor tracks 14 of the discharge structure 52 a highly doped second area 16 of the same type of conduction as the drift section 11. This creates an ohmic contact on the same potential line of the semiconductor body 5 of the semiconductor device 3 so that each field plate 12 which is contacted by the conductor tracks 14 remains at this potential. Furthermore, the highly doped $n^+$-conducting second areas 16 underneath the conductor tracks 14 support the low-resistance connection between the field plates 12 and ensure a low contact resistance to the field plates 12.

It is also provided that the field plates 12 have a first and a second end 17 and 18, wherein the first end 17 is oriented towards the first electrode 7 and the second end 18 is oriented towards the second electrode 9 and wherein the conductor tracks 14 of the discharge structure 4 contact the field plates 12 close to their first ends 17 in groups or in a ring line. In principle, it is also possible that the conductor tracks 14 cross the field plates 12 at any position.

In addition, a complementarily-doped first area 19 can be arranged towards the second electrode 9 by forming a pn junction at the highly doped second area 16. This complementarily-doped first area 19 forms a non-conducting pn junction 20 and spans the space charge zone further in the direction of the second electrode 9. In this context, this p-conducting region is floating. The advantage of this structure is the fast discharging of the field plates 12 without any threshold when the semiconductor device 3 changes from the non-conducting to the conducting state. In addition, the magnitude of the drift section 11 between the field plate connections is not restricted by a p-conducting region as in the prior art, as a result of which a low turn-on resistance of the semiconductor device 3 can be achieved.

The electrically conducting material of the field plates 12 can have a metal or be a highly doped, for example $n^+$- or $p^+$-conducting, polysilicon. In both cases, ohmic contacting by conductor tracks 14 is possible without problems, the field distribution within the field plate 12 exhibiting a constant potential from one end 17 of the field plate 12 to the other end 18 of the field plate 12. The insulating layer 24 which surrounds the field plates 12 has, for example, silicon dioxide or silicon nitride, wherein the silicon dioxide can be formed by thermal oxidation of the silicon of the trench walls 22 and 23.

Figure 9:
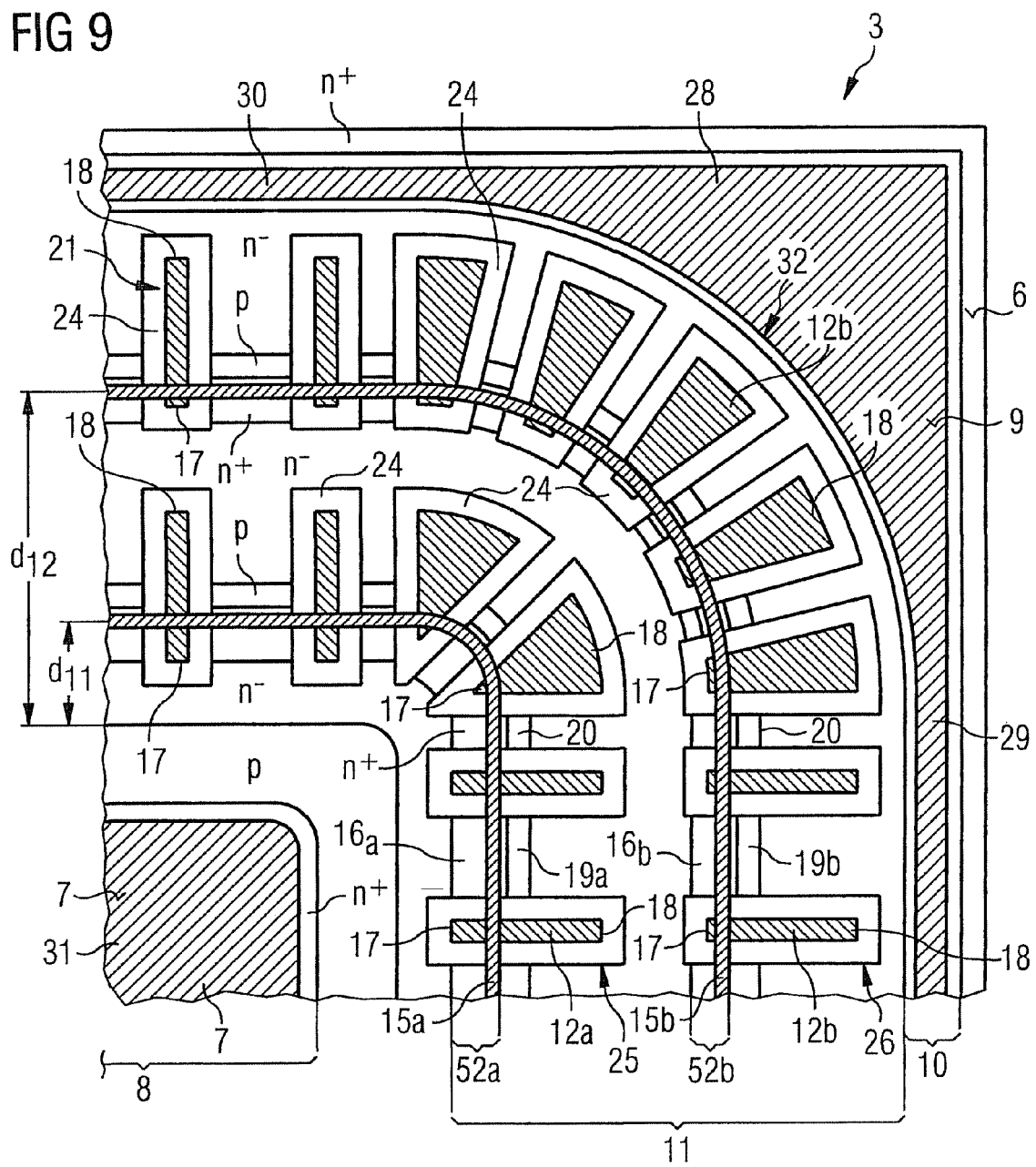
FIG. 9 illustrates a diagrammatic top view of a semiconductor device of a further embodiment.

Furthermore, it is provided to arrange the first and the second electrode 7 and 9 as comb structures with comb spines and comb webs arranged perpendicularly to the comb spine, wherein the comb webs of the comb structures are arranged within one another and a lateral drift section 11 is formed between the comb webs. Into this lateral drift section 11, insulated field plates 12 can then protrude vertically, laterally oriented, whereas the conductor tracks 14 of a discharge structure 52 now electrically connect the field plates 12 to one another with identical drift section lengths d in meander form between the comb webs. In this embodiment, the principle of the field plates 12 and of the field plate discharge is only transferred to more complex structures of the first and the second electrode 7 and 9, respectively, as illustrated in FIG. 9.

The discharge structure 52 according to the invention can be applied both to diodes and to MOSFETs, and to IGBTs and to JFETs. If the semiconductor device is arranged as diode, the first electrode is an anode and the second electrode is a cathode. For this purpose, the first near-surface zone 8 of the semiconductor body 5 has a second conduction type and the second near-surface zone 10 of the semiconductor body 5 has a first conduction type, the dopant concentration of the drift section 11 being distinctly lower than the dopant concentration of the second near-surface zone 10 of the semiconductor body 5.

If the discharge structure is used for a semiconductor device of the MOSFET type, the first electrode 7 has a source electrode S and the second electrode 9 has a drain electrode D as illustrated in FIG. 6. Below the source electrode S and below the drain electrode D, a highly doped semiconductor zone 8 and 10, respectively, of the same type of conduction as the drift section 11 is arranged. In addition, this source semiconductor zone is surrounded by a body zone 33 of a type of conduction complementary to the drift section 11 and to the highly doped semiconductor zones 8 and 10, respectively. Although the structure is essentially identical, at least as far as the drift section 11 is concerned, in the semiconductor device of the MOSFET type and in the semiconductor device of the IGBT type, the first electrode 7 in the IGBT type is an emitter electrode E and the second electrode 9 is a collector electrode KE. Below the emitter electrode E, a highly doped emitter semiconductor zone of the same type of conduction as the drift section 11 is arranged, this emitter semiconductor zone being surrounded by a body zone 33 of a type of conduction complementary to the drift section 11 and wherein a semiconductor zone of the complementary type of conduction to the drift section 11 is arranged below the collector electrode KE. Seen from the emitter electrode E, this thus results in an npnp structure which is driven via an insulated gate electrode G for the conducting case by the combination of an n-channel MOS and a pnp transistor, the base of the pnp transistor being driven via the MOS.

In a method for producing a semiconductor device 3 with field plates according to FIGS. 5 and 6, a semiconductor wafer is first patterned, as described above for the semiconductor devices 1 and 2, from a semiconductor body 5 with semiconductor devices patterned in semiconductor chip positions. After this patterning, a strip-shaped or ring-shaped or island-shape incorporation of dopants of complementary conductivity to the drift section 11 is produced in higher concentration than the drift section 11 on the same drift section length $d_{11}$ for a first area 19. Following this, a strip-shaped or ring-shaped or island-shaped incorporation of dopants of identical conductivity as the drift section 11 occurs in higher concentration than the first floating complementary area 19 for a second area 16 with the same drift section length $d_{11}$ for a discharge structure 52.

After that, laterally oriented vertical trench structures 21 can be incorporated into the lateral drift section 11 by crossing the discharge structure 52. This is followed by a deposition of an insulating layer 24 on the walls 22 and 23 of the trench structures 21 and a filling-up of the trench structures 21 with a conducting material. After that, the lateral diode, or MOSFET and/or IGBT structures are completed by applying at least one patterned insulating layer 35 to the semiconductor wafer. This is followed by a deposition of electrodes 7 and 9 and of conductor tracks 14 of the discharge structure 52 in windows of the insulating layer 35, by which means the field plates 12 are electrically connected to one another in groups and/or in a ring line via the conductor tracks 14 at identical drift section lengths $d_{11}$. In this method, it is provided that the trench structures 21 and the coupling structures 4 can be produced on a semiconductor wafer basis even before the semiconductor wafer is separated into individual semiconductor chips. This reduces the cost of producing individual semiconductor chips.

In a further performance of the method, a strip-shaped or ring-shaped or island-shaped complementarily-doped area is incorporated by forming a pn junction to the drift section material before incorporating dopants of the same conductivity as the drift section 11. This has the advantage that, in the direction of the second electrode 9, a pn junction is produced which spans the space charge zone in the direction of the second electrode 9. For incorporating this complementarily-doped area, a masking layer is again applied, but with wider windows for penetrating dopant than for the incorporation of the highly doped areas. For incorporating the highly doped areas, further windows are incorporated in the windows of the masking layer but which are arranged to be displaced in the direction of the first electrode compared with the wide windows for the complementary area. These areas are also arranged to be narrower than the first ones. The result is that the space charge zone which forms between the first and the second electrode in the non-conducting case does not reach the conductor track of the discharge structure 52 and thus the field plates 12 themselves.

For the strip-shaped incorporation of dopants for the discharge structure 52, an ion implantation can be carried out with subsequent diffusion of the incorporated dopants. It is also possible first to deposit a dopant-containing layer on the masking layer and subsequently to carry out an indiffusion of the dopants into the semiconductor wafer at the positions which are provided for the strip-shaped application of dopants.

Even before incorporating laterally oriented vertical trench structures 21 into the lateral drift section 11, a patterned masking layer is first applied to the semiconductor wafer which has windows in the areas of the field plates 12. Following this, an anisotropic etching can take place in which the drift section material is removed in the area of the trench structures 21 and trench structures 21 vertically penetrate into the lateral drift section 11. For this purpose, a reactive ion etching is carried out as anisotropic etching method, in which reactive ions from an ion plasma are accelerated in the direction of the top side 6 of the semiconductor body 5. After the trench structure 21 has been produced in this manner, the walls 22 and 23 of the trench structure 21 can be provided with an insulating layer 24 by an isotropic oxidation of the drift section material. It is also possible to deposit a silicon nitride layer or TEOS layer out of the gas phase on the trench walls 22 and 23 as well.

For filling up the trench structure 21 with a conducting material, a highly doped conducting polysilicon can be deposited in the trench structures 21. If the field plate 12 has metal as conducting material, this can be chemically or galvanically deposited and fill up the trench structure 21 in this process. Using these materials in the trench structure 21, the turn-on resistance of such semiconductor devices 1, 2 and 3 can be reduced.

For selectively depositing electrodes and conductor tracks of the discharge structure 52, currentless chemical or electrolytic methods for metal deposition can be provided. However, it is also possible here to produce particularly the conductor tracks 14 of the discharge structure 52 by deposition of highly doped polysilicon, wherein, if necessary, silicides are arranged underneath the polysilicon for the purpose of contacting, a deposition of conductor tracks 14 of the discharge structure 52 is also carried out by depositing aluminium in a vaporizing plant. This method has been found to be successful, on the one hand, and, on the other hand, is cost effective and can be carried out for the entire semiconductor wafer. Incorporation in a package can be carried out either by casting in a plastic package compound or by incorporating the devices of the semiconductor device in prepared cavity packages.

Figure 7:
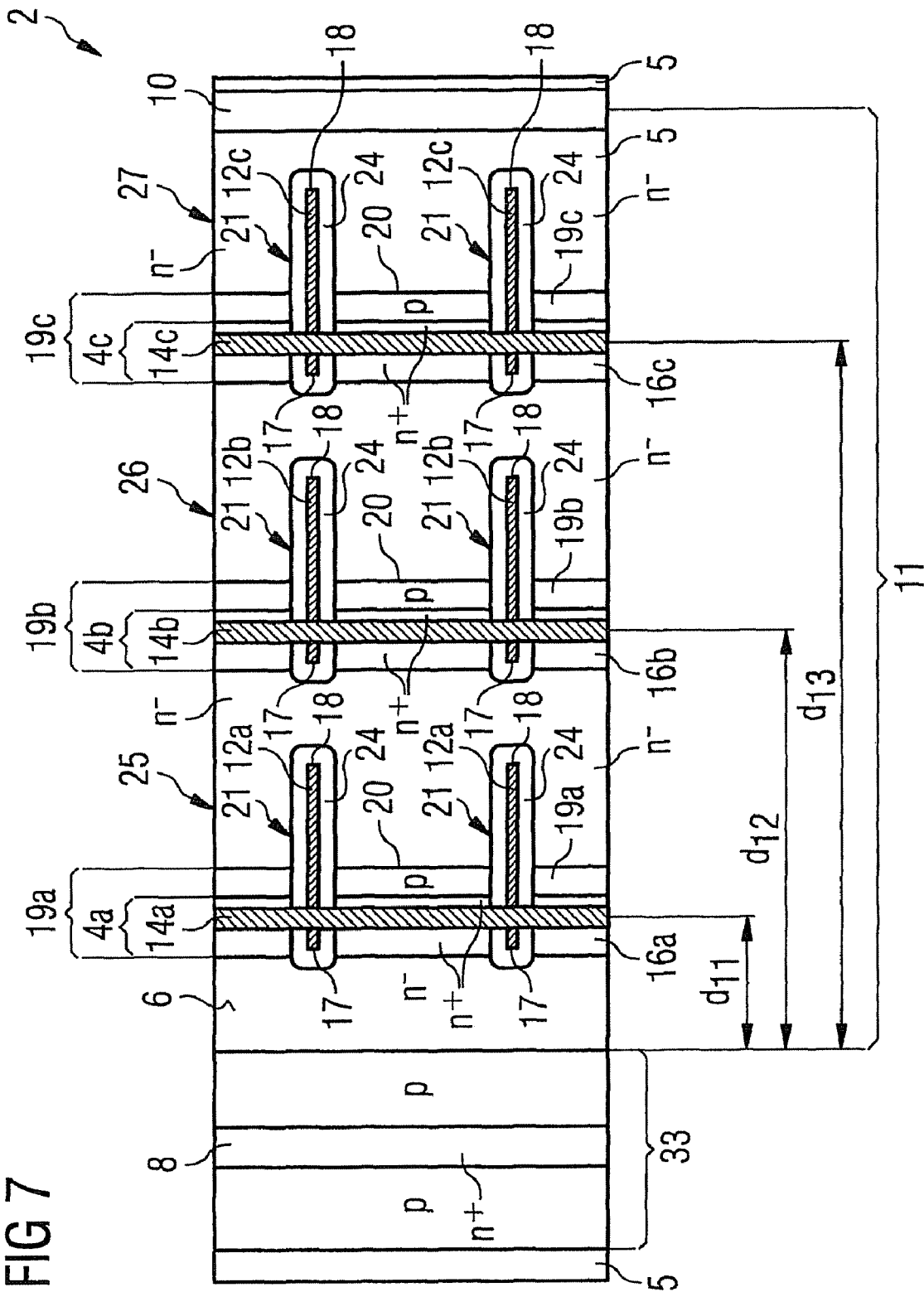
FIG. 7 illustrates a diagrammatic top view of a semiconductor device of a further embodiment.

FIG. 7 illustrates a diagrammatic top view of a semiconductor device 40 of a further embodiment. Devices having the same functions as in the preceding figures are identified by the same reference symbols and not especially explained. In this embodiment, the discharge structure 52 has a number of parallel conductor tracks 14a, 14b and 14c which, by direct contact with the field plate groups 25, 26 and 27, can discharge these field plates 12a, 12b and 12c arranged in groups during the switching of the semiconductor device 2 from the non-conducting case to the conducting case. For this purpose, the conductor tracks 14a, 14b and 14c are arranged on three different drift section lengths $d_{11}$, $d_{12}$ and $d_{13}$. The entire drift section 11 is thus divided into individual sections which has the advantage that the potential difference within the drift section is less from one end 17 to the other end 18 of each field plate 12a, 12b and 12c than if the entire drift section 11 is only equipped with a single elongated field plate 12.

This also means that the thickness of the insulating layer 24 which surrounds each field plate 12a, 12b and 12c can be minimized, the field plates 12a, 12b and 12c in each case having or holding a constant potential over their length which is given by the drift section lengths $d_{11}$, $d_{12}$ and $d_{13}$. The discharge structure 52 again has below the conductor track 14a, 14b and 14c highly doped $n^+$-conducting second areas 16a, 16b and 16c, respectively, which are arranged in strip-shaped p-conducting first areas 19a, 19b and 19c and have an ohmic contact to the drift section 11. By forming the field plate groups 25, 26 and 27, a thinner insulating layer 24 can thus be provided around each of the field plates 12a, 12b and 12c as protection against the potential of the drift section 11, as a result of which less material of the drift section 11 is needed for the field plate structures.

Figure 8:
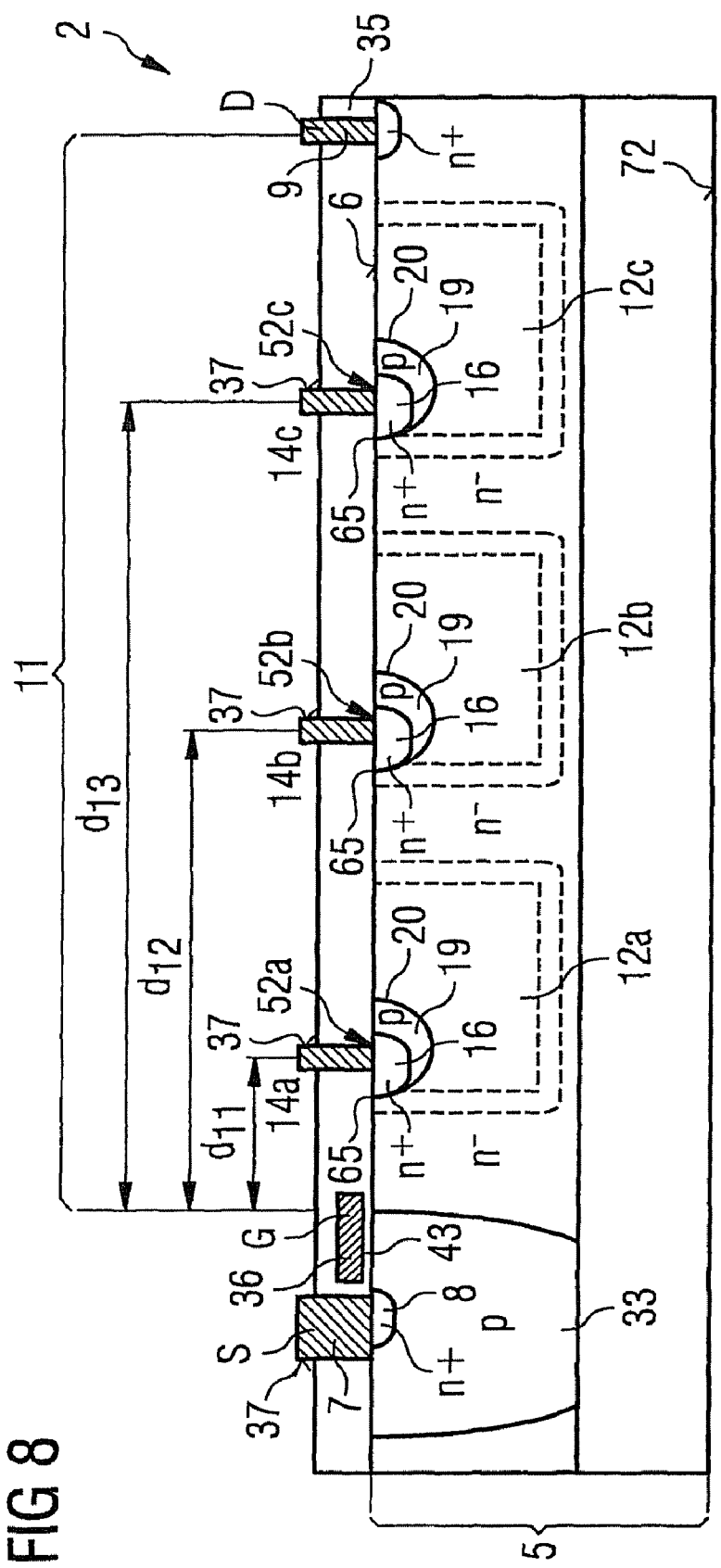
FIG. 8 illustrates a diagrammatic cross section through the semiconductor device according to FIG. 7.

FIG. 8 illustrates a diagrammatic cross section through the semiconductor device 40 according to FIG. 7, wherein the top side 6 of the semiconductor body 5 now has a structure of an insulating layer 35, applied to the top side 6. On the top side 6 of the semiconductor body 5, a control structure with a control electrode 36 as insulated gate electrode G can now be seen. Furthermore, a source electrode S is illustrated as first electrode 7 and a drain electrode D is illustrated as second electrode 9. The conductor tracks 14a, 14b and 14c belong to the discharge structure 52 illustrated in FIG. 7 and connect the field plates 12a, 12b and 12c to one another in groups.

In this cross-sectional view, the field plates 12a, 12b and 12c are drawn with dashed lines because the sectional plane does not extend through these field plates. The insulating layer 35 has windows 37 to the top side 6 of the semiconductor body 5. The first electrode 7 is arranged as source electrode S of a MOSFET and the second electrode 9 is arranged as drain electrode D in the windows 37 in order to contact the near-surface zones 8 and 10, respectively. In addition, the conductor tracks 14a, 14b and 14c are arranged in the windows 37 of the insulating layer 35 and contact the field plates 12a, 12b and 12c. In addition, the conductor tracks 14a, 14b and 14c in each case contact a strip-shaped $n^+$-conducting second area 16a, 16b and 16c which is a device of the discharge structure 52 for the field plates 12.

In principle, it is possible to arrange an elongated field plate 12 laterally between the two electrodes 7 and 9 in the drift section 11 as illustrated in FIG. 6, which protrudes vertically into the drift section 11. But it is of advantage to arrange a number of field plates 12 laterally behind one another in groups on different drift section lengths $d_{11}$, $d_{12}$, $d_{13}$ of the drift section 11 and to provide for each group a conductor track 14a, 14b, 14c of the discharge structure 52 which electrically connects the field plates 12 of a group with the same drift section length $d_{11}$, $d_{12}$ or $d_{13}$.

This has the advantage that a lower potential difference occurs within the drift section 11 from one end 17 of the field plate 12 to the other end 18 of the field plate 12 when a number of groups of field plates 12 are arranged behind one another in the drift section 11, than if only one elongated field plate 12 is arranged in each case in the drift section 11, especially since then the insulating layer 24 must shield a distinctly higher potential difference between the field plate end 18 not connected to a conductor track and the drift section 11. In the case of a single elongated field plate 12, the thickness of the insulating layer 24 which surrounds the field plates 11 must be selected to be distinctly thicker, at the same drain-source voltage, which is at the expense of the drift section width. It is thus of advantage to arrange a number of field plates 12 laterally behind one another in groups on different drift section lengths d of the drift section 11.

FIG. 9 illustrates a diagrammatic top view of a semiconductor device 50 of a further embodiment. In this top view, a corner area of a semiconductor chip area or of a tooth of a comb structure, respectively, can be seen. An inner ring electrode 31 covers the centre of the semiconductor chip as first electrode 7. An outer ring electrode 28 is arranged as second electrode 9 in a rounded corner area 32 and in edge areas 29 and 30 of the semiconductor chip. Between the outer ring electrode 28 and the inner ring electrode 31, a drift section 11 with two groups 25 and 26 of field plates 12a and 12b is arranged. It is just as well possible to provide the first electrode in the edge area and the second electrode in the inner area.

These field plates 12a and 12b are again electrically connected to one another at identical drift section lengths $d_{11}$ and $d_{12}$ via conductor tracks in the form of ring lines 15a and 15b of the discharge structures 52a and 52b, the drift section lengths $d_{11}$ and $d_{12}$ being identical. Instead of the ring lines, short connecting lines can also be provided between field plates and the adjacent dopant regions 16. However, ring lines have the advantage that they ensure identical potentials on all field plates of a group. Analogously, drift sections between comb-shaped electrodes can be equipped, for example, as discharge structure for field plates by using meander-shaped conductor tracks. It is also possible to provide any other drift section geometries with field plates 12 and with correspondingly adapted discharge structures 52 and conductor tracks 14. The embodiment illustrated in FIG. 9 varies in the arrangement of the first and of the second electrode 7 and 9 and utilizes even corners occurring in semiconductor chips in order to reduce, on the one hand, the forward resistance of the semiconductor device 50 with the aid of the field plates 12 and, on the other hand, to ensure fast switching from non-conduction to conduction with the aid of the discharge structure 52 via ring lines 15a and 15b.

Figure 10:
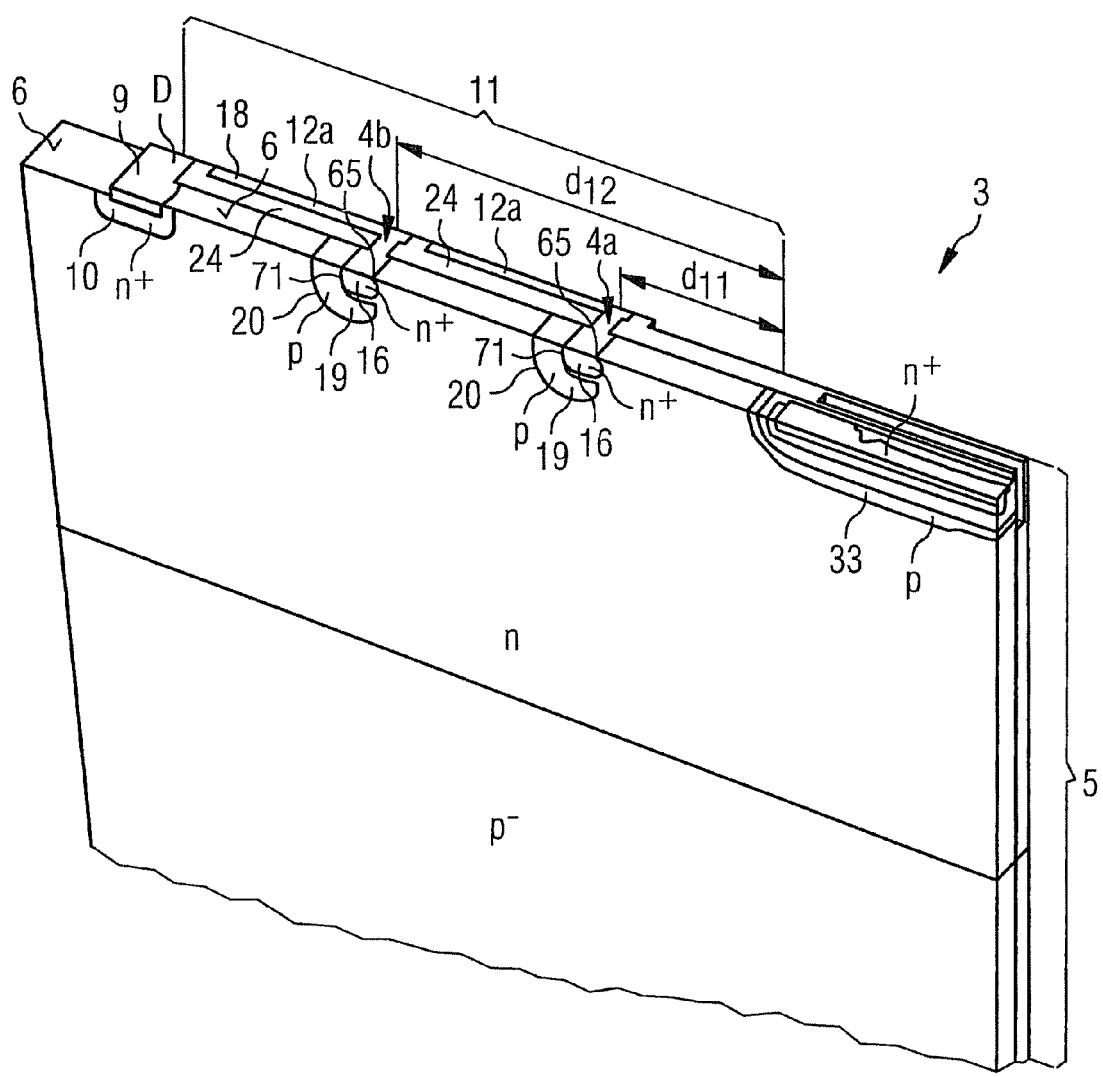
FIG. 10 illustrates a diagrammatic, perspective view of a cross-sectional area of a semiconductor device according to a further embodiment.

FIG. 10 illustrates a diagrammatic perspective view of a cross-sectional area of a semiconductor device 60 according to a further embodiment, dopant concentrations and pn junctions 20 and 71 being identified with the near-surface lines illustrated here. In this context, the pn junction 20 between the n-conducting drift section material and the p-conducting material of the first area 16 forms a larger space charge zone than the $n^+p$ junction 71 between the $n^+$-conducting second area 16 and the p-conducting first area 19. FIG. 10 also illustrates that the $n^+$-conducting second area 16 with the n-conducting drift section material has an ohmic contact area.

FIG. 11 illustrates the cross-sectional area of the semiconductor device 60 in the non-conducting case according to FIG. 10 with the potential distribution 13 within the semiconductor body 5 which is illustrated by corresponding equipotential lines 39. In this arrangement, the pn junction 20 or the complementarily-conducting first area 19, respectively, ensures that the space charge zone, or the resultant equipotential lines, respectively, spread towards the second near-surface zone 10 so that the space charge zone can be spanned further in the direction of the second near-surface zone 10.

Figure 12:
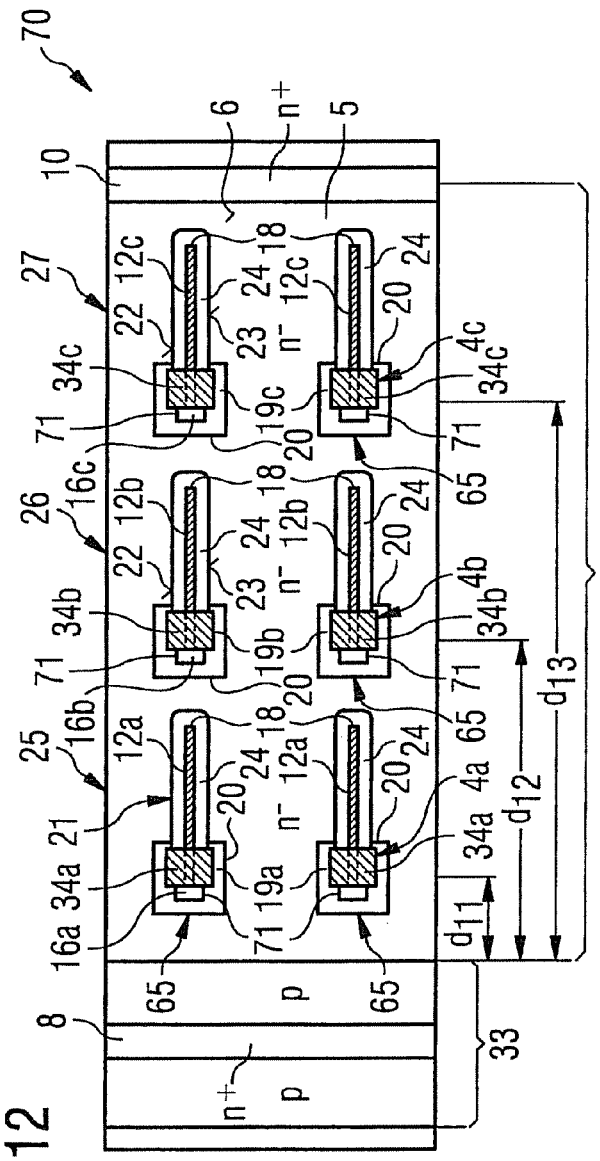
FIG. 12 illustrates a diagrammatic top view of a semiconductor device of a further embodiment.
Figure 13:
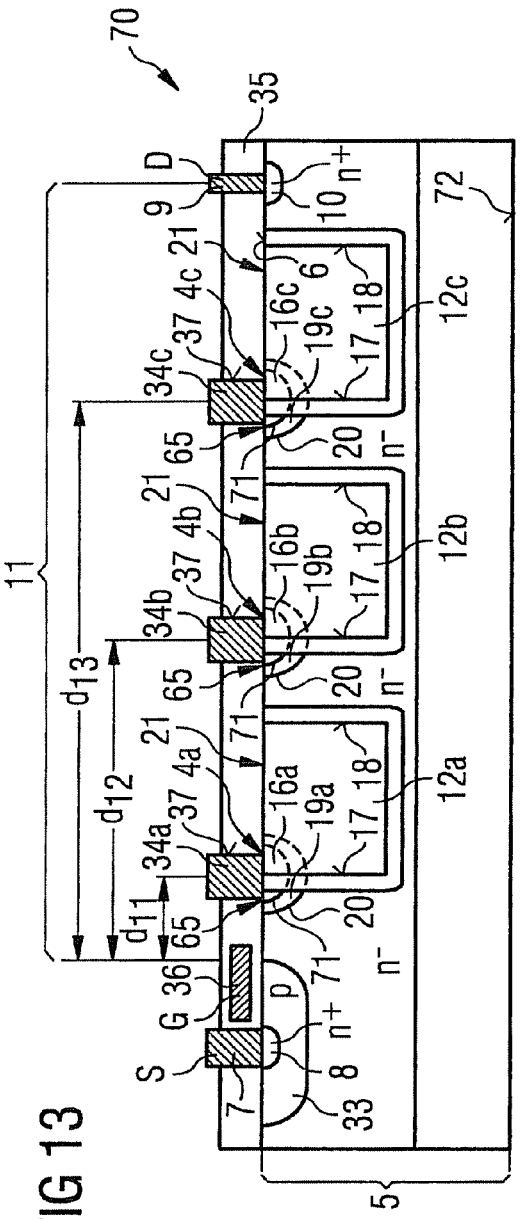
FIG. 13 illustrates a diagrammatic cross section through the semiconductor device according to FIG. 12.

FIG. 12 illustrates a diagrammatic top view of a semiconductor device 70 of a further embodiment. Devices having the same functions as in the preceding figures are identified by the same reference symbols and not especially explained. In this embodiment, a plurality of field plates 12a, 12b and 12c are arranged laterally behind one another or offset behind one another and in field plate groups 25, 26 and 27 next to one another in the drift section 11 and protrude vertically into the drift section 11 as is illustrated in FIG. 13. The field plates are individually electrically connected to coupling structures 4a, 4b and 4c, allocated to them individually, via field plate contacts 34.

The coupling structures 4a, 4b and 4c in each case have a first area 19a, 19b and 19c which is doped complementarily to the drift section and a highly doped second area 16a, 16b and 16c, arranged in the first area 19a, 19b and 19c, which is doped and geometrically dimensioned in such a manner that it provides for a punch-through effect to the drift section 11 for each of the field plates 12a, 12b and 12c. In this context, the respective field plate contact 34a, 34b and 34c is arranged in such a manner that it contacts both the first area 19a, 19b and 19c and the second area 16a, 16b and 16c. The advantage of such a coupling structure over a punch-through effect has already been discussed with FIGS. 1 and 2 so that another explanation can be omitted.

The entire drift section 11 is thus divided into individual sections which has the advantage that the potential difference within the drift section 11 is less from one end 17 to the other end 18 of each field plate 12a, 12b and 12c than if the entire drift section 11 is only equipped with a single elongated field plate 12 as in FIG. 1. This also means that the thickness of the insulating layer 24 which surrounds each field plate 12a, 12b and 12c can be minimized, the field plates 12a, 12b and 12c in each case having or holding a constant potential over their length which is given by the drift section lengths $d_{11}$, $d_{12}$ and $d_{13}$. The coupling structure 4 again has highly doped $n^+$-conducting areas 16a, 16b and 16c which are arranged in p-conducting areas 19a, 19b and 19c, respectively. Due to the formation of the field plate groups 25, 26 and 27, a thinner insulating layer 24 can thus be provided around each of the field plates 12a, 12b and 12c as protection against the potential of the drift section 11, as a result of which less material of the drift section 11 is needed for the field plate structures.

FIG. 13 illustrates a diagrammatic cross section through the semiconductor device according to FIG. 12, wherein the top side 6 of the semiconductor body 5 now has a structure of an insulating layer 35 applied to the top side 6. On the top side 6 of the semiconductor body 5, a control structure with a control electrode 36 as insulated gate electrode G can now been seen. Furthermore, a source electrode S is illustrated as first electrode 7 and a drain electrode D is illustrated as second electrode 9. The insulating layer 35 has windows 37 to the top side 6 of the semiconductor body 5.

The first electrode 7 is arranged as source electrode S of a MOSFET and the second electrode 9 is arranged as drain electrode D in the windows 37 in order to contact the near-surface zones 8 and 10, respectively. In addition, the field plate contacts 34a, 34b and 34c are arranged in windows 37 of the insulating layer 35 and contact the field plates 12a, 12b and 12c and the first areas 19a, 19b and 19c and also the second areas 16a, 16b and 16c of the coupling structures 4a, 4b and 4c. The field plate contacts 34a, 34b and 35c can also be buried in the insulating layer 35 as electrodes or ohmic connecting elements.

FIG. 14 illustrates a diagrammatic cross section through a semiconductor device area 57 with coupling structure 4 incorporated by masking technology on a laterally arranged drift section 11. In this representation, the first electrode (not shown) is arranged to the left and the second electrode (not shown) is arranged to the right of the semiconductor device area 57 illustrated. The low voltage point 65 is thus located at the left-hand end of a floating complementary first area 19 to be incorporated in the horizontal drift section 11. As illustrated in FIG. 14a, a window 67 is first incorporated into an oxide layer 68 on the top side 6 of a semiconductor body 5 and an acceptor material such as boron is implanted and diffused into the n⁻-conducting material of the drift section 11 in the direction of the arrow Z. For the purpose of masking, a photoresist mask or another patterned auxiliary layer can also be used which can rest, e.g., on a thin oxide layer. After reaching a predetermined depth, illustrated in FIG. 14b, of the first floating area 19, the window 67 is partially covered, as illustrated in FIG. 14c, with a masking material 69, e.g. photoresist, and into the remaining window opening a second area 16 is highly doped by implanting and activating or slightly diffusing donor material such as arsenic or phosphorus. Following this, a conducting contact is deposited in the window 67 which contacts at least one of the two areas 16 or 19. Wherein, however, in the case of an ohmic transition from the n⁺-conducting area to the n-conducting material of the drift zone 11, only the n⁺-conducting area is contacted. Both vertical field plates in drift sections and horizontal field plates on high-voltage field plate edges can be electrically connected to this conducting contact.

Figure 14A:
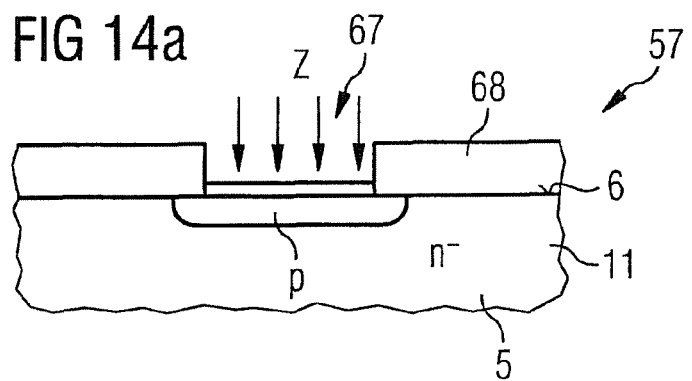
FIG. 14 illustrates a diagrammatic cross section through a semiconductor device area with discharge structure, incorporated by masking, on a laterally arranged drift section.
Figure 14B:
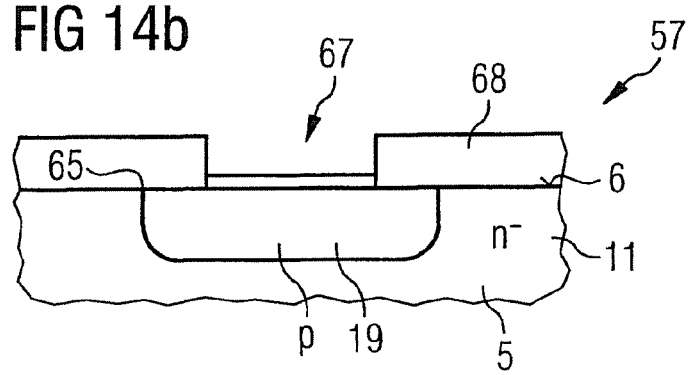
Figure 14C:
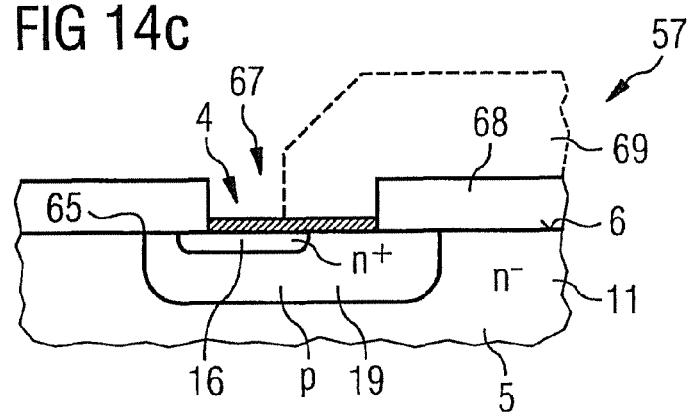
Figure 14D:
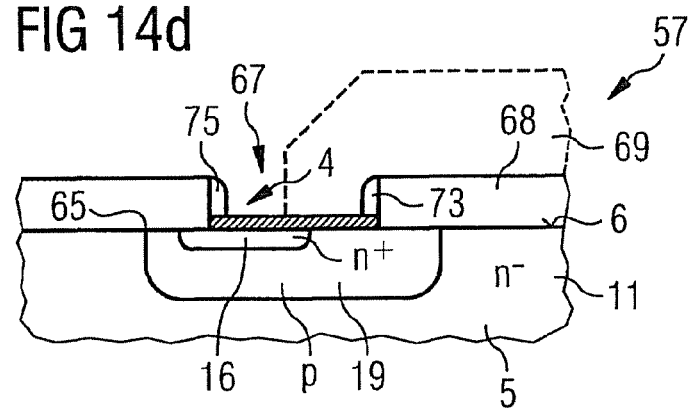

As illustrated here, this second area 16 is shielded from the second electrode by the first area 19 in the non-conducting case but provides for a punch-through effect on switch-over into the conducting case. As an alternative, as illustrated in FIG. 14d, a spacer 73 can be formed in the window 67 after the boron implantation so that the outdiffusion of boron can possibly be omitted so that only annealing and activating of the impurities is required after an ion implantation. The outdiffusion can also occur in a process when dopants are used, the diffusion coefficients of which are greatly different as, for example, in the case of arsenic and boron. Similar process sequences can be carried out in the case where n⁺-conducting areas are directly in contact with the drift zone.

FIGS. 15 to 20 diagrammatically illustrate in an overview the possible variations of coupling between field plates 12 and near-surface highly doped areas 16 and 19, and of the coupling of the near-surface areas 16 and 19 to one another. Devices having identical functions as in the preceding figures are identified by identical reference symbols and are not specially explained.

In this context, a semiconductor body is identified by 5, an insulating layer in the field plate trench by 24, a drift section by 11, a field plate by 12 and a field plate contact by 34 in FIGS. 15 to 20. A first area highly doped complementarily to the drift section 11 is identified by 19 and a second highly doped area of the same type of conduction as the drift section is identified by 16. The position of the low voltage point is marked by 65 and a charge carrier generation region is marked by 74.

Figure 15:
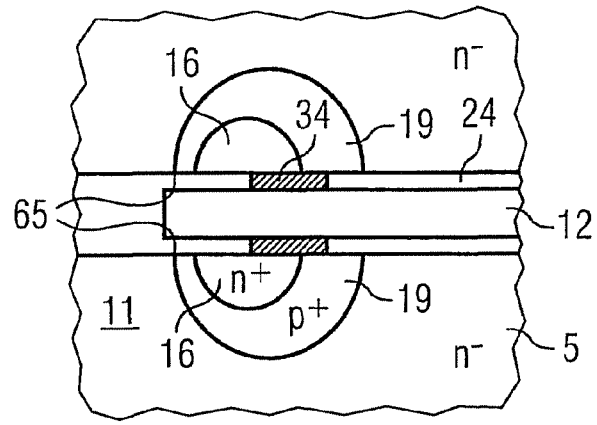
FIGS. 15 to 20 illustrate diagrammatic top views of possible variations of the coupling between field plate and highly doped near-surface areas.
Figure 16:
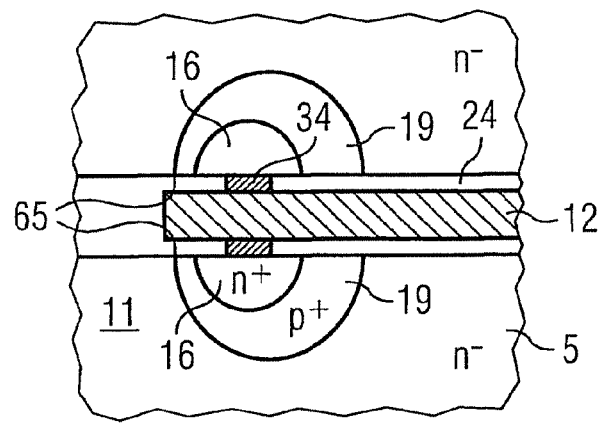
Figure 17:
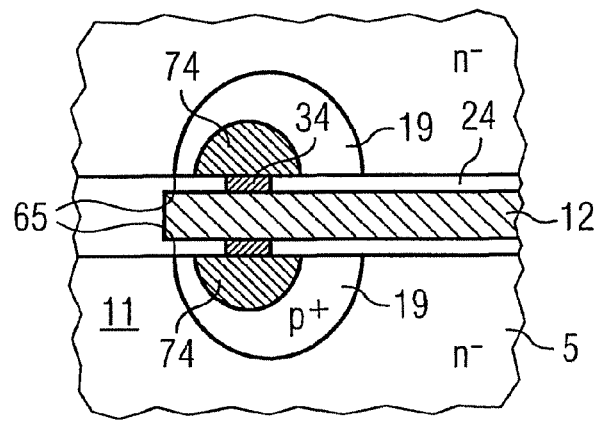

In the first three variations according to FIGS. 15, 16 and 17, the punch-through effect is utilized wherein in each case the second area 16 is arranged within the first area 19 and completely surrounded by it. In all three first variants according to FIGS. 15 to 17, the second area 16 is arranged asymmetrically in the first area 19 and displaced towards the low voltage point.

The first three variants differ in that, in FIG. 15, the pn junction between area 16 and area 19 is short-circuited by an ohmic field plate contact 34. In FIG. 16, the field plate 12 is only electrically connected to the second area 16 resistively via the field plate contact 34 so that an effective Zener clamping occurs with little Zener voltage between the first area 19 and the second area 16. In the third variant according to FIG. 17, the second area is implemented by a metallic region or another charge-carrier-generating region 74. The coupling between the first area 19 and the second area is now effected by the characteristics of the generating region 74 itself. In this context, the field plate contact 34 can also form the metallic or charge-carrier-generating region 74.

Figure 18:
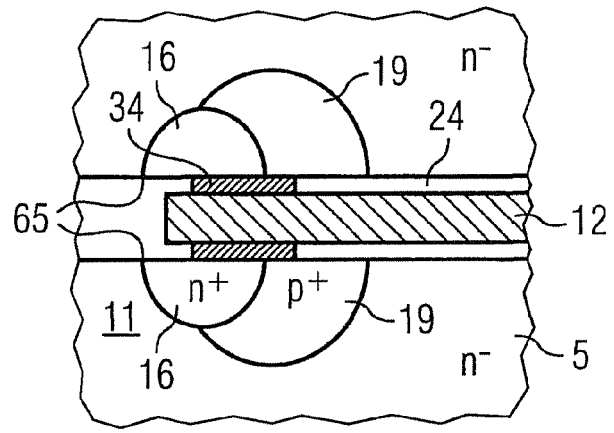
Figure 19:
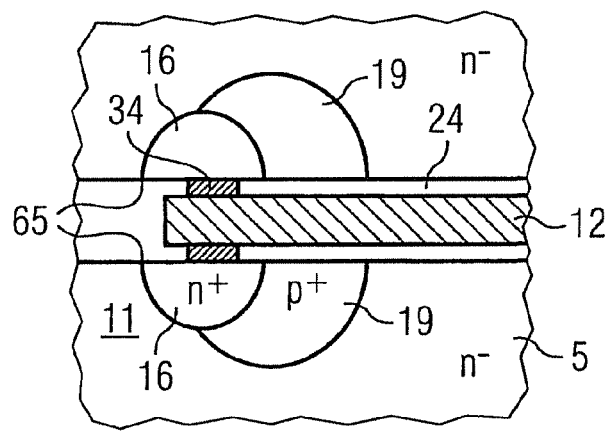
Figure 20:
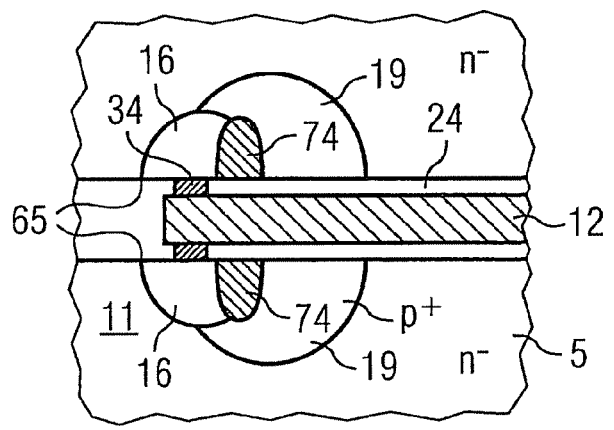

In all three other variants according to FIGS. 18 to 20, the second area 16 is on the low voltage point of the drift section 11 and is in contact with the drift section 11.

These three further variants differ in that, according to FIG. 18, an ohmic contact short-circuits the two areas 16 and 19 by the field plate contact 34. According to FIG. 19, the field plate contact 34 is only in ohmic contact with the second area. In the sixth variant according to FIG. 20, a region 74 with local generation centers is arranged between the first area 19 and the second area 16 so that the coupling takes place by the generating region so that the voltages between the first and the second area can differ only minimally.

Thus the semiconductor device comprise includes a semiconductor body 5. This semiconductor body 5 comprise includes a first electrode 7 which is electrically connected to a first near-surface zone 8 of the semiconductor body 5 and a second electrode 9 which is electrically connected to a second zone 10 of the semiconductor body 5. There is a drift section 11 which is arranged between the first and the second electrode 7, 9 in the semiconductor body 5. Further, a coupling structure 4 for at least one field plate 12 is arranged in the drift section. The coupling structure 4 comprise includes a floating first area 19 doped complementarily to the drift section and a second area 16 arranged in the first area, which includes a locally limited punch-through effect to the drift section. The field plate 12 is electrically connected to the first and/or the second area 19, 16.

The second area 16 is arranged within the first area 19 in such a manner that the second area 16 has the least possible distance to the low voltage point of the drift section 11.

In another embodiment the semiconductor device includes a semiconductor body 5. The semiconductor body 5 has a first electrode 7 which is electrically connected to a first near-surface zone 8 of the semiconductor body 5. Further, a second electrode 9 is electrically connected to a second zone 10 of the semiconductor body 5. A drift section 11 is arranged between the first and the second electrode 7, 9 in the semiconductor body 5 and a coupling structure 4 for at least one field plate 12 is arranged in the drift section. This coupling structure 4 has a floating first area 19 doped complementarily to the drift section and a second area 16 partially arranged in the first area, which has an ohmic contact to the drift section. The field plate 12 is electrically connected at least to the second area 16.

The coupling structure 4, as second area 16, has an area injecting or generating charge carriers which is highly doped and has the same charge carrier type as the drift section 11 and which is shielded from the second electrode 9 by the first complementarily-doped area 19 in the non-conducting case. The second area 16 is embedded in the first area and a pn junction 71 is arranged between the highly doped second area 16 and the complementarily-doped first_area 19. The coupling structure 4 has in the second area 16 foreign atoms or impurities which represent generation centres. This coupling structure 4 has in the second area 16 foreign atoms or impurities which act like an ohmic contact to the surrounding first area 19.

In a further embodiment the first complementarily-doped area 19 and the second area 16 are arranged in a near-surface area of the semiconductor body 5 with a lateral arrangement of the first and of the second electrode 7, 9. A number of field plates 12 with coupling structure 4 are arranged laterally behind one another in the drift section 11 between first and second electrode 7, 9 with a lateral current path between the first and the second electrode 7, 9.

Furthermore the first complementarily-doped area 19 and the second area 16 in the drift section 11, with a lateral arrangement of the first and of the second electrode 7, 9, are arranged in such a manner that the first area 19 is oriented in the direction of the second electrode 9 and the second area 16 is oriented in the direction of the first electrode 7.

Thus another embodiment includes a semiconductor device with field plate discharge structure of a semiconductor body 5, which has a first electrode 7 electrically connected to a first near-surface zone 8 of the semiconductor body 5 and a second electrode 9 which is electrically connected to a second zone 10 of the semiconductor body. A drift section 11 is arranged between the first and the second electrode 7, 9 in the semiconductor body 5 and field plates 12 which are insulated from the drift section 11, wherein the field plates 12 are laterally oriented and protrude vertically into the drift section 11.

Such a field plate discharge structure 52 with which the field plates 12 are coupled to the drift section by a locally limited punch-through effect or an ohmic contact. At least one electrically conducting conductor track 14 on the top side 6 of the semiconductor body 5 electrically connects at least two field plates 12 at the same drift section length. Further, the field plate discharge structure 52 with its conductor tracks 14 is oriented perpendicularly to the lateral direction of the field plates 12 and contacts the field plates 12 and at least one highly doped second area 16 of the same type of conduction as the drift section 11.

The field plates 12 have a first and a second end 17, 18, wherein the first end 17 is oriented towards the first electrode and the second end 18 is oriented towards the second electrode 9 and wherein the conductor tracks 14 of the field plate discharge structure 52 contact the field plates 12 close to their first ends 17 in groups or in a ring line 15.

It is possible to arrange the field plates 12 in a trench structure 21, wherein the trench walls 22, 23 have an insulating layer 24 and the trench structure 21 is filled up at least partially with an electrically conducting material. This conducting material of the field plates 12 includes a metal or a highly doped polysilicon whilst the insulating layer 24 includes silicon dioxide or silicon nitride.

A number of field plates 12 might be arranged laterally behind one another in groups 25, 26, 27 on different drift section lengths $d_{11}$, $d_{12}$, $d_{13}$ of the drift section 11, whilst the discharge structure 52 provides for each group 25, 26, 27 a conductor track 14 which electrically connects at least two field plates 12 of in each case one group with the same_drift section length $d_{11}$, $d_{12}$, $d_{13}$ In a further embodiment the first and the second electrode 7, 9 have comb structures with comb splines and comb webs arranged perpendicularly to the comb spline. The comb webs of the comb structures are arranged within one another and form between the comb webs a lateral drift section 11 into which the field plates 12 insulated from the drift section 11 protrude vertically or laterally oriented. The conductor tracks 14 of the discharge structure 52 electrically connect the field plates 12 to one another with identical drift section lengths $d_{11}$, $d_{12}$, $d_{13}$ meander-shaped between the comb webs. Alternatively the first and the second electrode 7, 9 can have ring structures, wherein the first electrode 7 forms an outer ring 28 along the edge areas 29, 30 of the top side 6 of the semiconductor body 5 and the second electrode 9 forms an inner ring 31. Between the rings 28, 31 a lateral drift section 11 protrudes vertically and radially oriented. In the round corner areas 32 of the ring structure the conductor tracks 14 of the discharge structure 52 are electrically connect to the field plates 12 with one another at identical drift section lengths $d_{11}$, $d_{12}$, $d_{13}$ in a ring shape between the ring structures A method for producing a number of semiconductor chips for semiconductor devices 1, 2, 3 with field plate coupling structure 4 to a drift section 11 includes the following. At first a semiconductor wafer from a semiconductor body 5 with semiconductor device structures in semiconductor chip positions is prepared. The device structures are provided for lateral diode, or MOSFET and/or IGBT structures with a lateral drift section 11 between a first near-surface zone 8 of the semiconductor body 5. A second near-surface zone 10 of the semiconductor body 5 and for a first electrode 7 and a second electrode 9 are also prepared.

Dopants of a type of conduction complementary to the drift section 11 with identical drift section lengths $d_{11}$ for floating first areas 19 into the drift section are incorporated. Dopants of the same type of conduction as the drift section 11 with identical drift section lengths $d_{11}$ in higher concentration than the drift section 11 for highly doped second areas 16 are incorporated as coupling structure 4 close to a low voltage point 65 of the first area 19. Further, a laterally oriented vertical trench structures 21 is incorporated into the lateral drift section 11, which extend into the coupling structure 4. Furthermore, an insulating layer is deposited on the walls 22, 23 of the trench structures 21. Then the trench structures 21 are filled up with a conducting material to form field plates 12. Finally the lateral diode, or MOSFET and/or IGBT structures arte completed.

The second area 16 can be incorporated in the first area 19 in such a manner that the second area 16 is shielded by the first area 19 and the first area 19 is incorporated in the semiconductor body 5 from the top side to such a depth that the second area 16, to be incorporated thereafter, is shielded from a space charge zone between a first electrode to be applied and a second electrode 7, 9.

The complementarily-doped first areas 19 can be incorporated by forming a pn junction 20 to the drift section material before incorporating dopants of the same conductivity as the drift section 11. With the incorporation of the second areas 16, further pn junctions with lesser blocking characteristics are produced between first and second areas 19, so that a punch-through effect can be utilized.

There is the possibility to deposit first and second electrodes 7, 9 and conductor tracks 14 of a discharge structure 52 n the semiconductor body, wherein the field plates 12 are electrically connected via the conductor tracks 14 with identical drift section lengths $d_{11}$. Further it is possible to apply a patterned masking layer 69 before the incorporation of dopants takes place. This mask covers the surface areas of the semiconductor body 5 which are to be protected against a penetration of dopant.

For incorporating a complementarily-doped first area_19, a masking layer with wider windows 67 for penetrating dopant is applied than for the incorporation of the highly doped second area 16 for which a masking layer 69 with windows 67 displaced towards the first electrode 7 is provided. For incorporating dopants, an ion implantation is carried out with subsequent diffusion of the incorporated dopants, a dopant-containing layer is deposited on the masking layer 69 patterned with windows 67 and subsequently an indiffusion of the dopants into the semiconductor wafer is carried out.

Before incorporating laterally oriented vertical trench structures 21 into the lateral drift section 11, a patterned masking layer is applied to the semiconductor wafer which has windows in the areas of the field plates. For incorporating laterally oriented vertical trench structures 21 into the lateral drift section 11, an anisotropic etching of drift section material is carried out by a dry reactive ion etching.

For depositing an insulating layer 24 on the walls 22, 23 of the trench structures 21, an isotropic oxidation of drift section material is carried out or silicon nitride is deposited on the trench walls 22, 23.

For filling up the trench structures 21 with a conducting material, a highly doped conducting polysilicon is deposited or a conducting material or a metal is deposited chemically or galvanically. Further, for depositing electrodes 7, 9 or conductor tracks 14 of the discharge structure 52, a currentless chemical or an electrolytic metal deposition is carried out. This can be done by a deposition of highly doped polysilicon in a uniform deposition of polysilicon on the entire semiconductor wafer and by a subsequent masked back etching.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device having a semiconductor body, comprising:
   a first electrode of the semiconductor body which is electrically connected to a first near surface zone of the semiconductor body;
   a second electrode which is electrically connected to a second zone of the semiconductor body;
   a drift section which is arranged between the first and the second electrode in the semiconductor body; and
   a coupling structure for at least one field plate arranged in the drift section;
   wherein the coupling structure has a floating first area doped complementarily to the drift section and a second area arranged in the first area which exhibits a locally limited punch through effect to the drift section; and
   wherein the field plate is electrically connected to the first and/or the second area.

2. The semiconductor device of claim 1, wherein the second area is arranged within the first area in such a manner that the second area exhibits the least possible distance to the low voltage point of the drift section.

3. The semiconductor device of claim 1, wherein the coupling structure, as second area, has an area injecting or generating charge carriers which is highly doped and has the same charge carrier type as the drift section and which is shielded from the second electrode by the first complementarily doped area in the nonconducting case so that the second area is embedded in the first area.

4. The semiconductor device of claim 1, wherein a pn junction is arranged between the highly doped second area and the complementarily doped first area and wherein the coupling structure has in the second area foreign atoms or impurities which represent generation centers.

5. The semiconductor device of claim 1, wherein the first complementarily doped area and the second area are arranged in a near surface area of the semiconductor body with a lateral arrangement of the first and of the second electrode.

6. The semiconductor device of claim 1, wherein a number of field plates with coupling structure are arranged laterally behind one another in the drift section between first and second electrode with a lateral current path between the first and the second electrode.

7. A semiconductor device having a semiconductor body, comprising:
   a first electrode of the semiconductor body which is electrically connected to a first near surface zone of the semiconductor body;
   a second electrode which is electrically connected to a second zone of the semiconductor body;
   a drift section which is arranged between the first and the second electrode in the semiconductor body; and
   a coupling structure for at least one field plate arranged in the drift section;
   wherein the coupling structure has a floating first area doped complementarily to the drift section and a second area partially arranged in the first area, which has an ohmic contact to the drift section; and
   wherein the field plate is electrically connected at least to the second area.

8. The semiconductor device of claim 7, wherein the first complementarily doped area and the second area in the drift section, with a lateral arrangement of the first and of the second electrode, are arranged in such a manner that the first area is oriented in the direction of the second electrode and the second area is oriented in the direction of the first electrode.

9. A semiconductor device with field plate discharge structure, comprising:
   a semiconductor body comprising:
      a first electrode of the semiconductor body which is electrically connected to a first near surface zone of the semiconductor body;
      a second electrode which is electrically connected to a second zone of the semiconductor body;
      a drift section which is arranged between the first and the second electrode in the semiconductor body;
      field plates which are insulated from the drift section, wherein the field plates are laterally oriented and protrude vertically into the drift section; and
      a field plate discharge structure via which the field plates are coupled to the drift section by a locally limited punch through effect or an ohmic contact and wherein at least one electrically conducting conductor track on the top side of the semiconductor body electrically connects at least two field plates at the same drift section length.

10. The semiconductor device of claim 9, wherein the field plate discharge structure with its conductor tracks is oriented perpendicularly to the lateral direction of the field plates and contacts the field plates and at least one highly doped second area of the same type of conduction as the drift section.

11. The semiconductor device of claim 9, wherein the field plates have a first and a second end, wherein the first end is oriented towards the first electrode and the second end is oriented towards the second electrode and wherein the conductor tracks of the field plate discharge structure contact the field plates close to their first ends in groups or in a ring line.

12. The semiconductor device of claim 9, wherein the field plates are arranged in a trench structure, wherein the trench walls have an insulating layer and the trench structure is filled up at least partially with an electrically conducting material.

13. The semiconductor device of claim 9, wherein the electrically conducting material of the field plates has a metal or a highly doped polysilicon.

14. The semiconductor device of claim 9, wherein the insulating layer has silicon dioxide or silicon nitride.

15. The semiconductor device of claim 9, wherein a number of field plates are arranged laterally behind one another in groups on different drift section lengths ($d_{11}$, $d_{12}$, $d_{13}$) of the drift section and the discharge structure provides for each group a conductor track which electrically_connects at least two field plates of in each case one group with the same drift section length ($d_{11}$, $d_{12}$, $d_{13}$).

16. The semiconductor device of claim 9, wherein the first and the second electrode have comb structures with comb splines and comb webs arranged perpendicularly to the comb spline, wherein the comb webs of the comb structures are arranged within one another and form between the comb webs a lateral drift section into which the field plates insulated from the drift section protrude vertically laterally oriented, whereas the conductor tracks of the discharge structure electrically connect the field plates to one another with identical drift section lengths ($d_{11}$, $d_{12}$, $d_{13}$) meander-shaped between the comb webs.

17. The semiconductor device of claim 9, wherein_the first and the second electrode have ring structures, wherein the first electrode forms an outer ring along the edge areas of the top side of the semiconductor body and the second electrode forms an inner ring and the electrodes form between the rings a lateral drift section into which the field plates insulated from the drift section vertically protrude radially oriented in the round corner areas of the ring structure and laterally oriented on the straight edge areas, whereas the conductor tracks of the discharge structure electrically connect the field plates with one another at identical drift section lengths ($d_{11}$, $d_{12}$, $d_{13}$) in a ring shape between the ring structures.

\* \* \* \* \*